United States Patent
Kim et al.

(10) Patent No.: US 11,425,831 B2
(45) Date of Patent: Aug. 23, 2022

(54) FOLDABLE ELECTRONIC DEVICE INCLUDING HIDDEN DAMPER

(71) Applicant: Samsung Electronics Co., Ltd., Suwon-si (KR)

(72) Inventors: Yundong Kim, Suwon-si (KR); Hokyung Kang, Suwon-si (KR); Bowoong Seo, Suwon-si (KR); Hyunchul Oh, Suwon-si (KR); Seokwoo Lee, Suwon-si (KR); Hyunsuk Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 190 days.

(21) Appl. No.: 16/863,212

(22) Filed: Apr. 30, 2020

(65) Prior Publication Data
US 2020/0352046 A1 Nov. 5, 2020

(30) Foreign Application Priority Data
May 3, 2019 (KR) .......................... 10-2019-0052467

(51) Int. Cl.
*H05K 5/02* (2006.01)
*H05K 5/00* (2006.01)

(52) U.S. Cl.
CPC ......... *H05K 5/0226* (2013.01); *H05K 5/0017* (2013.01); *H05K 5/0221* (2013.01)

(58) Field of Classification Search
CPC .... G06F 1/1616; G06F 1/1618; G06F 1/1652; G06F 1/1681; H05K 5/0226; H05K 5/0017; H05K 5/0221
See application file for complete search history.

(56) References Cited

U.S. PATENT DOCUMENTS

| | | | |
|---|---|---|---|
| 6,971,147 B2 * | 12/2005 | Halstead | A45C 1/06 24/303 |
| 8,390,411 B2 * | 3/2013 | Lauder | G06F 1/1677 335/219 |
| 8,705,229 B2 * | 4/2014 | Ashcraft | G06F 1/1679 312/223.1 |

(Continued)

FOREIGN PATENT DOCUMENTS

| KR | 10-2001-0063856 A | 7/2001 |
|---|---|---|
| KR | 10-2017-0082926 A | 7/2017 |
| KR | 10-2018-0083929 A | 7/2018 |

*Primary Examiner* — Hung S. Bui
*Assistant Examiner* — Sagar Shrestha

(57) ABSTRACT

A foldable electronic device including a foldable housing including: a hinge structure; a first housing structure connected to the hinge structure; and a second housing structure connected to the hinge structure and being foldable with the first housing structure about the hinge structure. The foldable electronic device further including a flexible display disposed to be viewable from outside of the device; a locker & closer configured such that the foldable housing maintains an unfolding status or a folding status; a first damper member disposed in the interior of the first housing structure and including a magnetic substance; and a second damper member disposed in the interior of the second housing structure and including a magnetic substance such that a repulsive force is applied when being adjacent to the first damper member. In addition, electronic devices according to various embodiments can be provided.

13 Claims, 15 Drawing Sheets

(56) References Cited

U.S. PATENT DOCUMENTS

| | | |
|---|---|---|
| 10,539,981 B2 | 1/2020 | Lin et al. |
| 10,666,780 B2 * | 5/2020 | Cho ........................ G06F 1/169 |
| 2004/0121824 A1 | 6/2004 | Lee |
| 2007/0133156 A1 * | 6/2007 | Ligtenberg ............ G06F 1/1679 |
| | | 361/679.27 |
| 2008/0158800 A1 * | 7/2008 | Aoyagi ................. G06F 1/1677 |
| | | 361/679.01 |
| 2010/0238620 A1 * | 9/2010 | Fish ...................... G06F 1/1681 |
| | | 361/679.09 |
| 2013/0286551 A1 * | 10/2013 | Ashcraft ............... G06F 1/1679 |
| | | 361/679.01 |
| 2014/0011548 A1 * | 1/2014 | Varela ..................... G06F 1/162 |
| | | 455/566 |
| 2015/0378397 A1 * | 12/2015 | Park ..................... G06F 1/1656 |
| | | 361/679.27 |
| 2017/0208157 A1 * | 7/2017 | Kim ....................... G06F 1/1652 |
| 2018/0364761 A1 * | 12/2018 | Lin ...................... H05K 9/0075 |
| 2018/0366813 A1 * | 12/2018 | Kim ....................... H01Q 21/00 |
| 2019/0028579 A1 | 1/2019 | Cho et al. |
| 2019/0258295 A1 * | 8/2019 | Fujimoto .................. G09F 9/00 |
| 2019/0320048 A1 * | 10/2019 | Yang ................... H04M 1/0247 |
| 2020/0019215 A1 * | 1/2020 | Wang ................... H05K 5/0017 |
| 2020/0267861 A1 * | 8/2020 | Kim ........................ H04B 1/40 |
| 2020/0293093 A1 * | 9/2020 | Kim ....................... G06F 1/1652 |
| 2020/0392759 A1 * | 12/2020 | Morrison ............ E05B 47/0006 |
| 2021/0333837 A1 * | 10/2021 | Xu ......................... F16C 11/12 |

* cited by examiner

FOLDABLE ELECTRONIC DEVICE INCLUDING HIDDEN DAMPER

CROSS-REFERENCE TO RELATED APPLICATION

This application is based on and claims priority under 35 U.S.C. 119 to Korean Patent Application No. 10-2019-0052467 filed on May 3, 2019 in the Korean Intellectual Property Office, the disclosure of which is herein incorporated by reference in its entirety.

BACKGROUND

1. Field

The disclosure relates to a foldable electronic device, and more particularly, to an electronic device including a hidden damper.

2. Description of Related Art

As mobile communication services have been expanded to multimedia service areas, users have come to use multimedia services as well as voice communications or text messages through electronic devices. The electronic devices have been equipped with display panels of gradually wider sizes so that the users do not feel inconvenience when they use the multimedia services. In addition, in recent years, foldable electronic devices equipped with flexible display panels have been disclosed.

SUMMARY

In a foldable electronic device, two different housings contact each other in a folding operation. In order to prevent damage to an external appearance of a product due to an impact, a member (hereafter, a 'impact absorbing member') that alleviates a physical impact may be provided on a surface of a housing.

In some embodiments, an impact absorbing member (e.g., rubber) may be provided at a portion (for example, a bezel area), except for a display part on a surface of a housing. However, a space for disposing the impact absorbing member on the surface of the housing may be made narrow to secure a wide display part. That is, the expansion of the display part may make it difficult to provide the impact absorbing member on the surface of the housing.

The disclosure provides an electronic device that can alleviate an impact of a foldable housing without restricting expansion of a display part in a foldable housing that provides a display screen.

In accordance with an aspect of the disclosure, a foldable electronic device includes: a foldable housing including: a hinge structure; a first housing structure including a first surface facing a first direction, a second surface facing a second direction that is opposite to the first direction, a first side surface connected to the hinge structure and being parallel to an axis of rotation of the hinge structure, a second side surface facing a direction that is opposite to the first side surface, and a third side surface that is perpendicular to the axis of rotation of the hinge structure; and a second housing structure including a third surface facing a third direction, a fourth surface facing a fourth direction that is opposite to the third direction, a fourth side surface connected to the hinge structure and being parallel to the axis of rotation of the hinge structure, a fifth side surface facing a direction that is opposite to the fourth side surface, and a sixth side surface that is perpendicular to the axis of rotation of the hinge structure, the second housing structure being foldable with the first housing structure about the hinge structure; a flexible display being viewed from the outside through at least one surface of the foldable housing, and extending from the first surface of the first housing structure to the third surface of the second housing structure; a locker & closer configured such that the foldable housing maintains an unfolding status against an external force of a first threshold external force or less or the foldable housing maintains a folding status when an external force of a second threshold external force is applied or a folding angle between the first housing structure and the second housing structure is smaller than a specific angle; a first damper member disposed to a location that is farther than the locker & closer with reference to the hinge structure in the interior of the first housing structure; and a second damper member disposed at a location that is symmetrical to the first damper member with reference to the hinge structure in the interior of the second housing.

In accordance with another aspect of the disclosure, a foldable electronic device includes: a foldable housing including: a hinge structure; a first housing structure connected to the hinge structure; and a second housing structure connected to the hinge structure, and being foldable with the first housing structure about the hinge structure; a flexible display disposed to be adjacent to one surface of the foldable housing so as to be viewed from the outside through at least one surface of the foldable housing; a locker & closer and configured such that the foldable housing maintains an unfolding status against an external force of a first threshold external force or less or the foldable housing maintains a folding status when an external force of a second threshold external force is applied or a folding angle between the first housing structure and the second housing structure is smaller than a specific angle; a first damper member disposed to a location that is farther than the locker & closer with reference to the hinge structure in the interior of the first housing structure, and including a magnetic substance; and a second damper member disposed at a location that is symmetrical to the first damper member with reference to the hinge structure in the interior of the second housing structure, and including a magnetic substance such that a repulsive force is applied when being adjacent to the first damper.

In accordance with another aspect of the disclosure, a foldable electronic device includes: a foldable housing including: a first hinge structure having a first axis of rotation; a second hinge structure having a second axis of rotation that is parallel to the first axis of rotation; a first housing structure including a first surface facing a first direction, a second surface facing a second direction that is opposite to the first direction, a first side surface connected to the first hinge structure and being parallel to the first axis of rotation of the first hinge structure, a second side surface facing a direction that is opposite to the first side surface, and a third side surface that is perpendicular to the first axis of rotation of the hinge structure; a second housing structure including a third surface facing a third direction, a fourth surface facing a fourth direction that is opposite to the third direction, a fourth side surface connected to the first hinge structure and being parallel to the first axis of rotation of the hinge structure, a fifth side surface facing a direction that is opposite to the fourth side surface, and a sixth side surface that is perpendicular to the first axis of rotation of the hinge structure, the second housing structure being foldable with the first housing structure about the first hinge structure; and a third housing structure including a fifth surface facing a fifth direction, a sixth surface facing a sixth direction that is opposite to the fifth direction, a seventh side surface connected to the second hinge structure, an eighth side surface facing a direction that is opposite to the seventh side surface, a ninth side surface that is perpendicular to the axis of rotation of the second hinge structure, and being foldable with the second housing structure about the second hinge structure; a flexible display being viewed from the outside through at least one surface of the foldable housing, and extending from the first surface of the first housing structure to the third surface of the second housing structure and the fifth surface of the third housing structure; a first magnetic substance disposed to be adjacent to the third side surface of the first housing structure, and a second magnetic substance disposed to be adjacent to the sixth side surface of the second housing structure and disposed at a location that is symmetrical to the first magnetic substance with reference to the first hinge structure; a third magnetic substance disposed to be adjacent to the third side surface of the first housing structure, and a fourth magnetic substance disposed to be adjacent to the sixth side surface of the second housing structure and disposed at a location that is symmetrical to the third magnetic substance with reference to the first hinge structure; and a fifth magnetic substance disposed to be adjacent to the ninth side surface of the third housing structure and disposed at a location that is symmetrical to the fourth magnetic substance with reference to the second hinge structure, and a sixth magnetic substance disposed to be adjacent to the ninth side surface of the third housing structure and disposed at a location that is symmetrical to the second magnetic substance with reference to the second hinge structure.

According to various embodiments of the disclosure, a foldable electronic device that can effectively alleviate an impact in an operation of folding the foldable housing by providing damper members at sites of the electronic device can be provided.

According to various embodiments of the disclosure, a foldable electronic device for easy unfolding and folding operations, including a locker & closer configuration having an open lock function of maintaining a status in which the foldable housing is unfolded and a closer function of folding the foldable housing can be provided.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
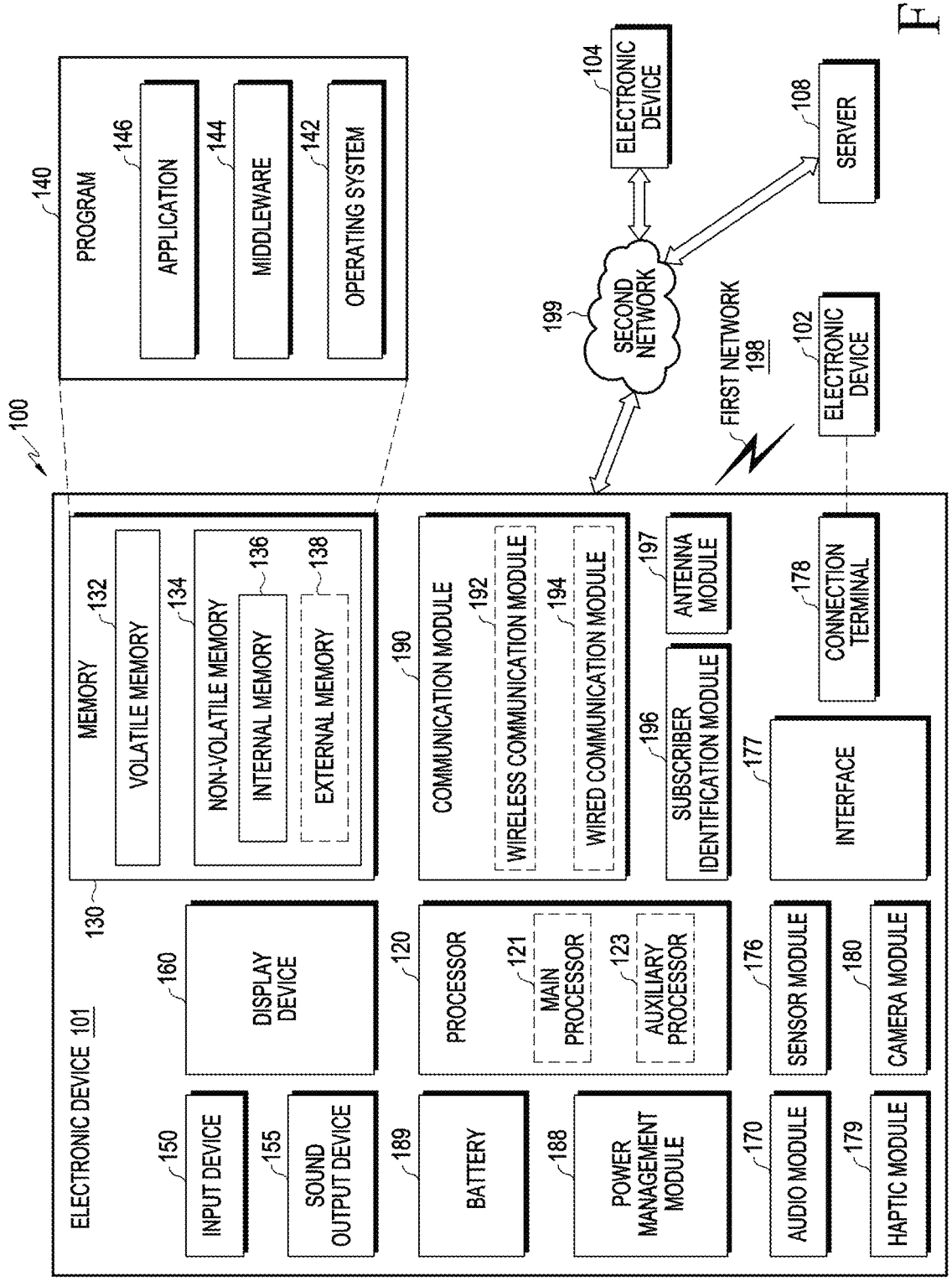
FIG. 1 illustrates a block diagram of an electronic device in a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
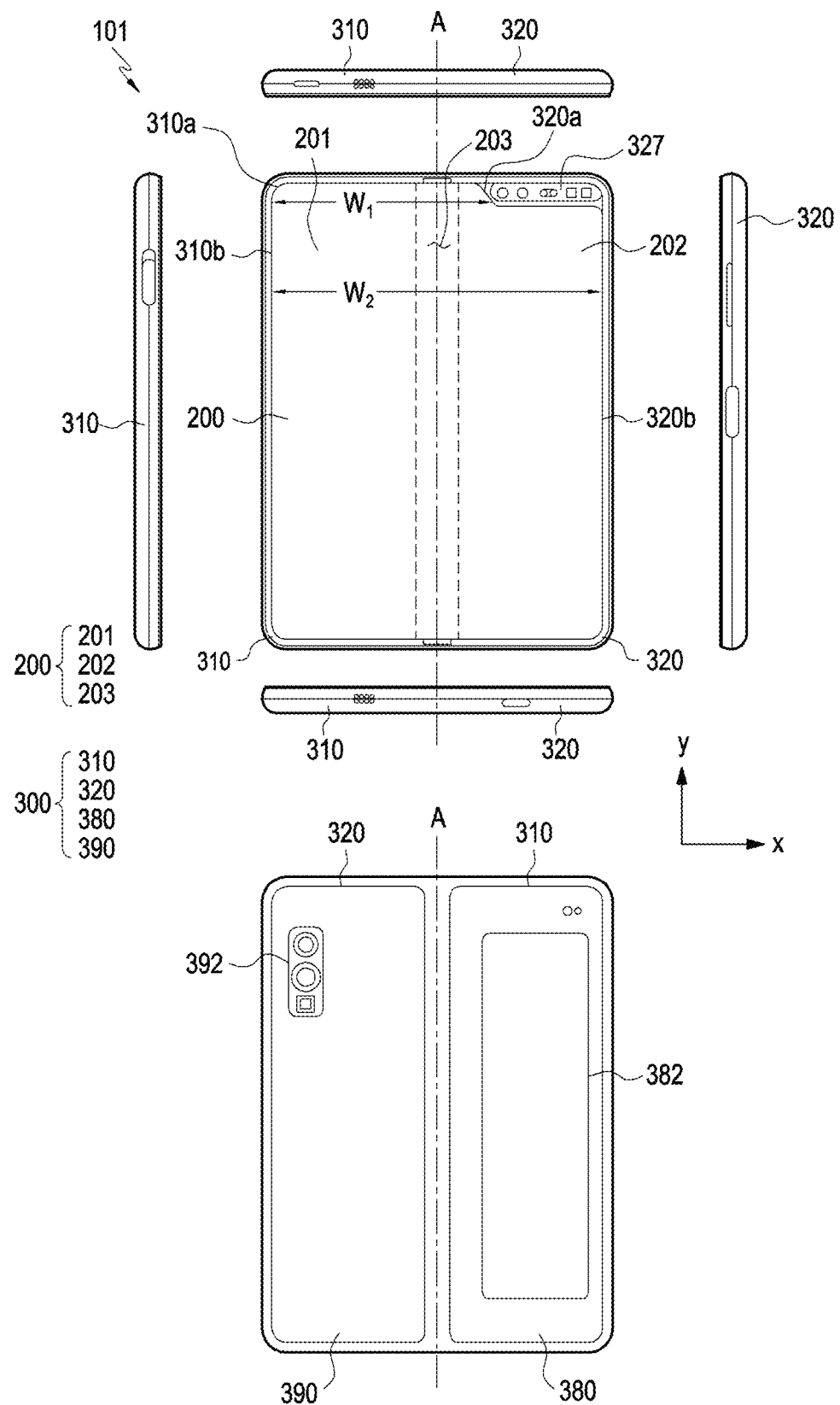
FIG. 2 is a view illustrating an unfolding status of an electronic device according to various embodiments of the disclosure.
Figure 3:
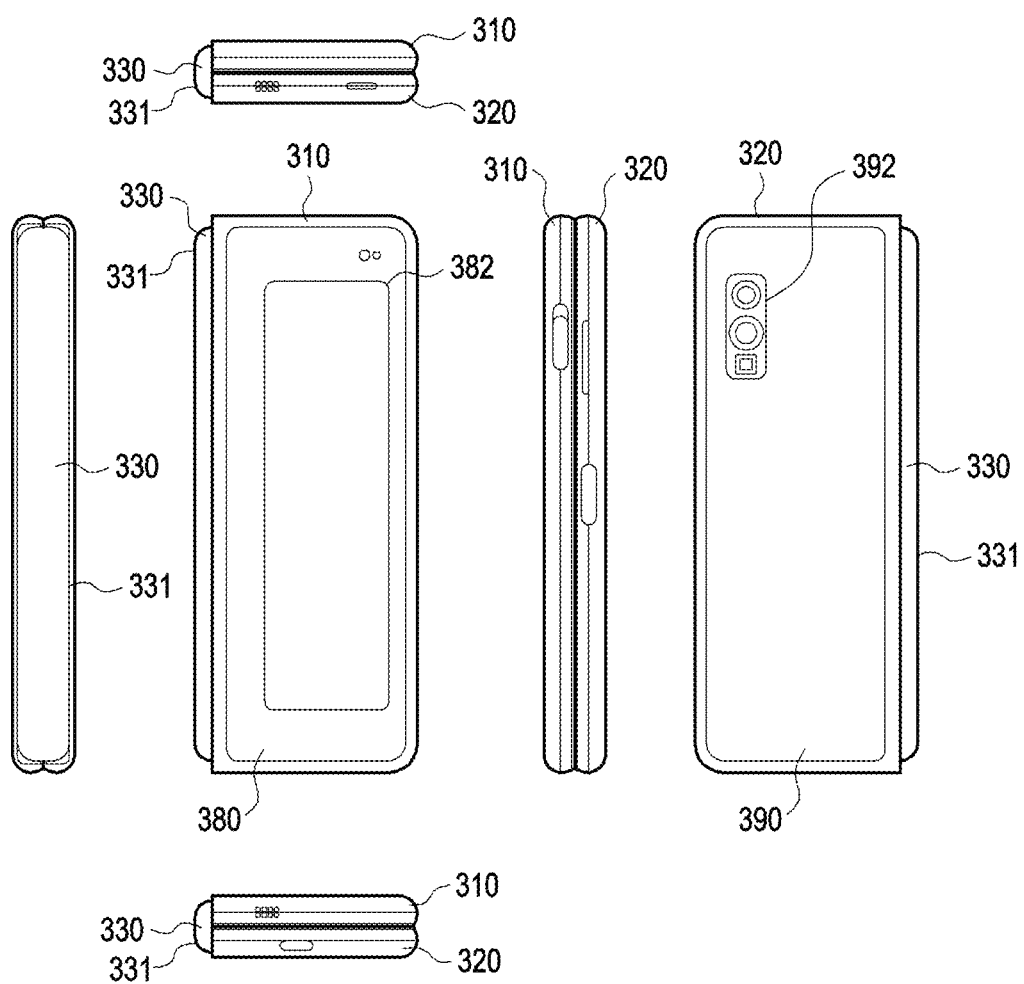
FIG. 3 is a view illustrating a folding status of an electronic device according to various embodiments of the disclosure.

FIG. 2 is a view illustrating an unfolding status of an electronic device 101 according to various embodiments of the disclosure. FIG. 3 is a view illustrating a folding status of an electronic device 101 according to various embodiments of the disclosure.

Referring to FIGS. 2 and 3, in an embodiment, an electronic device 101 may include a foldable housing 300, a hinge structure 330, a hinge cover 331 that defines an outer surface of the hinge structure 330 and covers a foldable portion of the foldable housing 300, and a flexible or foldable display 200 (hereinafter, briefly, referred to as "a display" 200) (e.g., the display device 160 of FIG. 1) disposed in a space defined by the foldable housing 300. According to an embodiment, a surface on which the display 200 is disposed (or a surface through which the display 200 may be viewed from the outside of the electronic device 101) may be defined as a front surface of the electronic device 101. Further, an opposite surface of the front surface may be defined as a rear surface of the electronic device 101. Surfaces that surround a space between the front surface and the rear surface may be defined as side surfaces of the electronic device 101.

According to various embodiments, the foldable housing 300 may include a first housing structure 310, a second housing structure 320 including a sensor area 327, a first rear cover 380, a second rear cover 390, and a hinge structure 330. The foldable housing 300 of the electronic device 101 is not limited to the shape and coupling state illustrated in FIGS. 2 and 3, and may be realized through another shape or another combination and/or coupling of components. For example, in another embodiment, the first housing structure 310 and the first rear cover 380 may be integrally formed, and the second housing structure 320 and the second rear cover 390 may be integrally formed.

According to various embodiments, the first housing structure 310 may include a first surface (e.g., 311 of FIG. 4, which will be described below) connected to the hinge structure 330 and facing a first direction, and a second surface (e.g., 312 of FIG. 4, which will be described below) facing a second direction that is opposite to the first direction. The second housing structure 320 may include a third surface (e.g., 321 of FIG. 4, which will be described below) connected to the hinge structure 330 and facing a third direction, and a fourth surface (e.g., 322 of FIG. 4, which will be described below) facing a fourth direction that is opposite to the third direction, and may be rotated about the hinge structure 330 (or an axis A of rotation) with respect to the first housing structure 310. The electronic device 101 may be changed to a folding status or an unfolding status, and this will be described below with reference to FIGS. 4 and 5.

According to various embodiments, the first housing structure 310 and the second housing structure 320 may be disposed on opposite sides of the axis A of rotation, and the first housing structure 310 and the second housing structure 320 may have shapes that are symmetrical to each other with respect to the axis A of rotation as a while in the unfolding status of the foldable housing 300. As described below, the angle or distance between the first housing structure 310 and the second housing structure 320 may be changed according to whether the electronic device 101 is in an unfolding status, a folding status, or an intermediate status, in which the electronic device 101 is partially unfolded. According to the embodiment illustrated in FIGS. 2 and 3, the second housing structure 320 additionally includes the sensor area 327, in which various sensors are disposed, unlike the first housing structure 310, but they may have symmetrical shapes in other areas. However, the shapes of the first housing structure 310 and the second housing structure 320 are not necessarily limited thereto. According to another embodiment, the first housing structure 310 and the second housing structure 320 may have asymmetrical shapes. For example, the screen display area of the first housing structure 310 may be wider than the screen display area of the second housing structure 320. For example, although it is illustrated in FIGS. 2 and 3 that the hinge structure 330 is disposed at a central area and the first housing structure 310 and the second housing structure 320 are folded about the hinge structure 330 in a symmetrical form, but unlike this, the hinge structure may be disposed in an area other than the central area of the electronic device 101 and the second housing structure 320 may be disposed in a form that is larger than that of the first housing structure 310.

According to various embodiments, as illustrated in FIG. 2, the first housing structure 310 and the second housing structure 320 may have recesses that accommodate the display 200 together. In an embodiment, due to the sensor area 327, the recesses may have two different widths in a direction that is perpendicular to the axis A of rotation.

According to an embodiment, the recesses may have a first width w1 between a first portion 310a of the first housing structure 310, which is parallel to the axis A of rotation, and a first portion 320a of the second housing structure 320, which is defined at a periphery of the sensor area 327. The recesses may have a second width w2 defined by a second portion 310b of the first housing structure 310, and a second portion 320b of the second housing structure 320, which does not correspond to the sensor area 327 and is parallel to the axis A of rotation. In this case, the second width w2 may be disposed to be longer than the first width w1. As another example, the first portion 310a of the first housing structure 310 and the first portion 320a of the second housing structure 320, which have asymmetrical shapes, may define the first width w1 of the recesses, and the second portion 310b of the first housing structure 310 and the second portion 320b of the second housing structure 320, which have symmetrical shapes, may define the second width w2 of the recesses. According to an embodiment, the distances of the first portion 320a and the second portion 320b of the second housing structure 320 from the axis A of rotation may be different. The widths of the recesses are not limited to the illustrated examples. In another embodiment, the recesses may have a plurality of widths due to the form of the sensor area 327 or the portions of the first housing structure 310 and the second housing structure 320, which have asymmetrical shapes.

In various embodiments, at least a portion of the first housing structure 310 and the second housing structure 320 may be formed of a metallic material or a nonmetallic material having a selected strength to support the display 200. The at least a portion formed of the metallic material may provide a ground plane of the electronic device 101, and may be electrically connected to a ground line formed in the printed circuit board (e.g., the board 520 of FIG. 4).

In various embodiments, the sensor area 327 may be disposed to have a predetermined area at a location that is adjacent to one corner of the second housing structure 320. However, the arrangement, shape, or size of the sensor area 327 is not limited to the illustrated example. For example, in another embodiment, the sensor area 327 may be provided to another corner of the second housing structure 320 or a predetermined area between an upper end corner and a lower end corner of the second housing structure 320. In an embodiment, the components for performing various functions embedded in the electronic device 101 may be exposed to the front surface of the electronic device 101 through the sensor area 327 or through one or more openings provided in the sensor area 327. In various embodiments, the components may include various kinds of sensors. The sensors, for example, may include at least one of a front camera, a receiver, or a proximity sensor.

According to various embodiments, the first rear cover 380 may be disposed on one side of the axis A of rotation on the rear surface of the electronic device 101, for example, may have a substantially rectangular periphery, and the periphery may be surrounded by the first housing structure 310. Similarly, the second rear cover 390 may be disposed on another side of the axis A of rotation of the rear surface of the electronic device 101, and the periphery may be surrounded by the second housing structure 320.

According to various embodiments, the first rear cover 380 and the second rear cover 390 may have shapes that are substantially symmetrical to each other with respect to the axis of rotation A. However, the first rear cover 380 and the second rear cover 390 do not necessarily have mutually symmetrical shapes, and in another embodiment, the electronic device 101 may include a first rear cover 380 and a second rear cover 390 of various shapes. In another embodiment, the first rear cover 380 may be integrally formed with the first housing structure 310, and the second rear cover 390 may be integrally formed with the second housing structure 320.

According to various embodiments, the first rear cover 380, the second rear cover 390, the first housing structure 310, and the second housing structure 320 may define spaces, in which various components (e.g., a printed circuit board or a battery) of the electronic device 101 may be disposed. In an embodiment, one or more components may be disposed through the rear surface of the electronic device or may be visually exposed. For example, at least a portion of a sub-display may be visually exposed through the first rear area 382 of the first rear cover 380. In another embodiment, one or more components or sensors may be visually exposed through the second rear area 392 of the second rear cover 250. In various embodiments, the sensors may include a proximity sensor and/or a rear camera.

According to various embodiments, the front camera exposed to the front surface of the electronic device 101 through one or more openings provided in the sensor area 327 or the rear camera exposed through the second rear area 392 of the second rear cover 390 may include one or a plurality of lenses, an image sensor, and/or an image signal processor. The flash, for example, may include a light emitting diode or a xenon lamp. In some embodiments, two or more lenses (an infrared ray camera, and a wide angle/telephoto lens), and image sensors may be disposed on one surface of the electronic device 101.

Referring to FIG. 3, the hinge cover 331 is disposed between the first housing structure 310 and the second housing structure 320, and may be configured to cover an internal component (e.g., the hinge structure 330). According to an embodiment, the hinge cover 331 may be covered by a portion of the first housing structure 310 and the second housing structure 320 or be exposed to the outside according to the status (the unfolding status (a flat status), an intermediate status, or a folding status) of the electronic device 101.

According to an embodiment, as illustrated in FIG. 2, when the electronic device 101 is in an unfolding status, the hinge cover 331 may not be exposed as it is covered by the first housing structure 310 and the second housing structure 320. As another example, as illustrated in FIG. 3, when the electronic device 101 is in a folding status (e.g., a full folding status), the hinge cover 331 may be exposed to the outside between the first housing structure 310 and the second housing structure 320. As another example, when the electronic device 101 is in an intermediate status in which when the first housing structure 310 and the second housing structure 320 define a predetermined angle, the hinge cover 331 may be partly exposed to the outside between the first housing structure 310 and the second housing structure 320. However, the exposed area may be smaller when the electronic device 101 is in the intermediate status than when the electronic device 101 is in a full folding status. In an embodiment, the hinge cover 331 may include a curved surface.

According to various embodiments, the display 200 may be disposed in a space defined by the foldable housing 300. For example, the display 200 may be seated on the recess defined by the foldable housing 300, and may constitute most of the front of the electronic device 101. Accordingly, the front surface of the electronic device 101 may include a display 200, and a partial area of the first housing structure 310 and a partial area of the second housing structure 320, which are adjacent to the display 200. Further, the rear surface of the electronic device 101 may include the first rear cover 380, and a partial area of the first housing structure 310, which is adjacent to the first rear cover 380, the second rear cover 390, and a partial area of the second housing structure 320, which is adjacent to the second rear cover 390.

According to various embodiments, the display 200 may refer to a display, at least a partial area of which may be deformed to a flat surface or a curved surface. According to an embodiment, the display 200 may include a folding area 203, a first area 201 disposed on one side (e.g., the left side of the folding area 203 illustrated in FIG. 2) of the folding area 203, and a second area 202 disposed on an opposite side (e.g., the right side of the folding area 203 illustrated in FIG. 2).

However, the classification of the areas of the display 200 illustrated in FIG. 2 is illustrative, and the display 200 may be classified into a plurality of areas (e.g., four or more or two) according to the structure or function of the display 230. For example, although the areas of the display 200 are classified by the folding area 203 or the axis A of rotation extending in parallel to the y axis in the embodiment illustrated in FIG. 2, the areas of the display 200 may be classified with reference to another folding area (e.g., a folding area that is parallel to the x axis) or another axis of rotation (e.g., an axis of rotation that is parallel to the x axis) in another embodiment. According to an embodiment, the display 200 may be coupled to or be disposed to be adjacent to a touch detection circuit, a pressure sensor that may measure the strength (the pressure) of a touch, and/or a digitizer that detects a stylus pen of a magnetic field type.

According to various embodiments, the first area 201 and the second area 202 may have shapes that are symmetrical to each other with respect to the folding area 203 as a whole. However, the second area 202, unlike the first area 201, may include a notch that is cut according to presence of the sensor area 227, but may have a shape that is symmetrical to the first area 201 in other areas. In other words, the first area 201 and the second area 202 may include parts having symmetrical shapes, and parts having asymmetrical shapes.

Hereinafter, the operations of the first housing structure 310 and the second housing structure 320 according to the operational statuses (e.g., the folding status, the unfolding status, and the intermediate status) of the electronic device 101, and the areas of the display 200 will be described.

According to various embodiments, when the electronic device 101 is in an unfolding status (e.g., FIG. 2), the first housing structure 310 and the second housing structure 320 may be disposed to face the same direction while defining an angle of 180 degrees therebetween. A surface of the first area 201 and a surface of the second area 202 of the display 200 may define 180 degrees therebetween, and may face the same direction (e.g., the forward direction of the electronic device). The folding area 203 may define the same plane as the first area 201 and the second area 202.

According to various embodiments, when the electronic device 101 is in a folding status (e.g., FIG. 3), the first housing structure 310 and the second housing structure 320 may be disposed to face each other. The surface of the first area 201 and the surface of the second area 202 of the display 200 may face each other while defining a small angle (e.g., 0 degrees to 10 degrees). At least a portion of the folding area 203 may be a curved surface having a predetermined curvature.

According to various embodiments, when the electronic device 101 is in the intermediate status, the first housing structure 310 and the second housing structure 320 may be disposed at a predetermined angle. The surface of first area 201 and the surface of the second area 202 of the display 200 may define an angle that is larger than in the folding status and is smaller than in the unfolding status. At least a portion of the folding area 203 may be a curved surface having a predetermined curvature, and the curvature then may be smaller than in the folding status.

According to the embodiment of FIG. 3, in the status in which the electronic device 101 is folded inwards, it is illustrated that the first surface (e.g., the first surface 311 of FIG. 4, which will be described below) of the first housing structure 310 faces the third surface (e.g., the third surface 321 of FIG. 4, which will be described below) of the second housing structure 320.

According to various embodiments, unlike the embodiment illustrated in FIG. 3, as the electronic device 101 is folded outwards, the second surface (e.g., the second surface 312 of FIG. 4, which will be described below) of the first housing structure 310 faces the fourth surface (e.g., the fourth surface 322 of FIG. 4, which will be described below) of the second housing structure 320.

According to various embodiments, the electronic device 101 may be not only be folded inwards but also be folded outwards, or may be selectively folded inwards or folded outwards.

Figure 4:
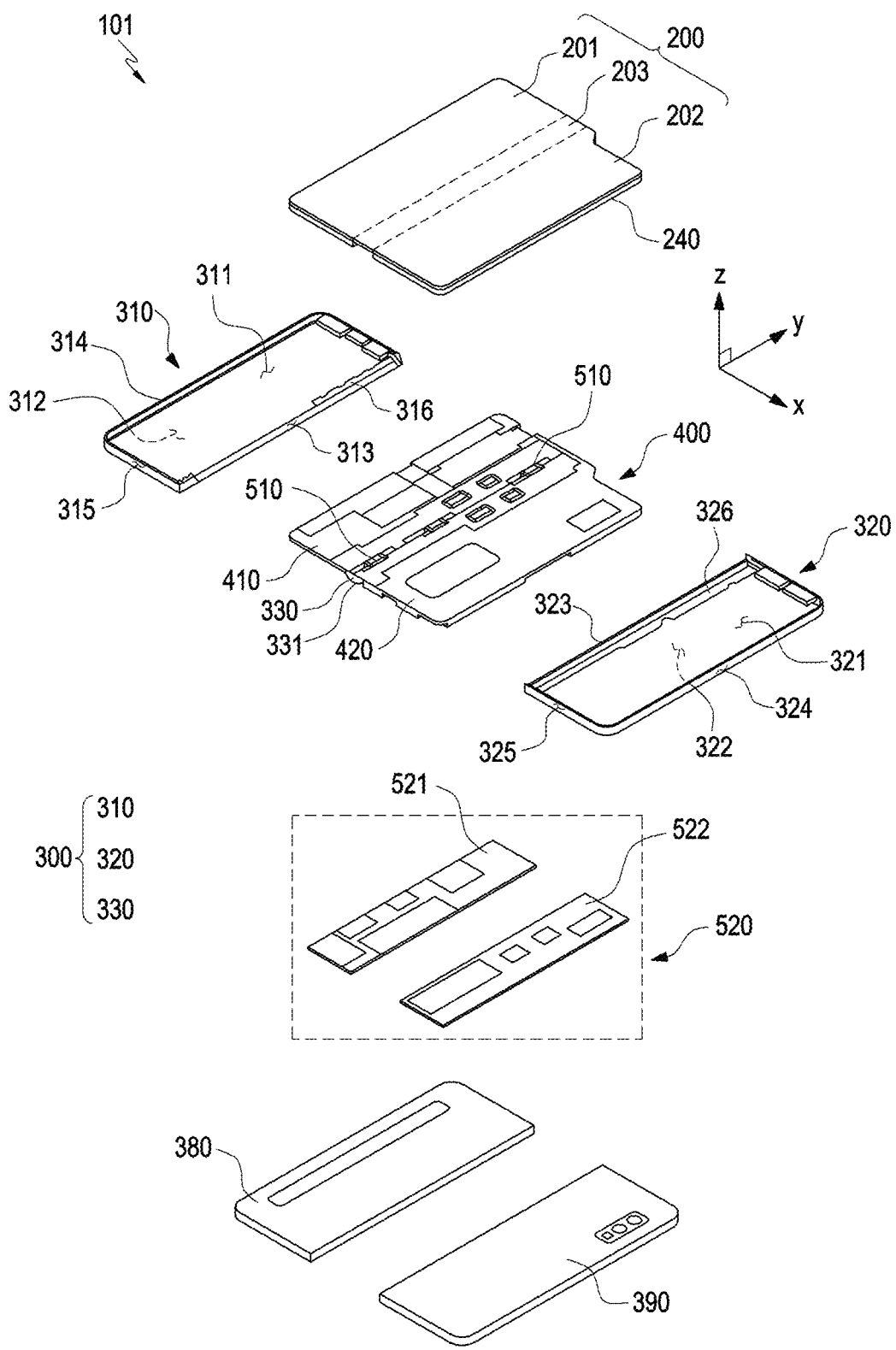
FIG. 4 illustrates an exploded perspective view of an electronic device according to various embodiments of the disclosure.

FIG. 4 illustrates an exploded perspective view of an electronic device according to various embodiments of the disclosure.

Referring to FIG. 4, in various embodiments, the electronic device 101 may include a foldable housing 300, a display 200, and a board 520. The foldable housing may include a first housing structure 310, a second housing structure 320, a bracket assembly 400, a first rear cover 380 and a second rear cover 390, and a connection structure 510.

According to various embodiments, the display 200 may include a display panel (e.g., a flexible display panel), and one or more plates or layers (e.g., a support plate 240), on which the display panel is seated. In an embodiment, the support plate 240 may be disposed between the display panel and the bracket assembly 400. A bonding structure may be located between the support plate 240 and the bracket assembly 400 to bond the support plate 240 and the bracket assembly 400.

According to various embodiments, the bracket assembly 400 may include a first support plate 410 and a second support plate 420. A connection structure 510 may be disposed between the first support plate 410 and the second support plate 420 such that a hinge operation is freely made, and a hinge cover 331 that covers the connection structure 510 such that the connection structure 510 is not viewed from the outside may be disposed. As another example, a printed circuit board (e.g., a flexible printed circuit (FPC)) may be disposed to cross the first support plate 410 and the second support plate 420.

According to various embodiments, the board 520 may include a first main circuit board 521 disposed on a side of the first support plate 410 and a second main circuit board 522 disposed on a side of the second support plate 420. The first main circuit board 521 and the second main circuit board 522 may be disposed in the interior of the space defined by the bracket assembly 400, the first housing structure 310, the second housing structure 320, the first rear cover 380, and the second rear cover 390. Components for realizing various functions of the electronic device 101 may be mounted on the first main circuit board 521 and the second main circuit board 522.

In various embodiments, the first housing structure 310 and the second housing structure 320 may be assembled to be coupled to opposite sides of the bracket assembly 400 in a status in which the display 200 is coupled to the bracket assembly 400. For example, the first housing structure 310 and the second housing structure 320 may be slid on the opposite sides of the bracket assembly 400 and be coupled to the bracket assembly 400.

According to various embodiments, the first housing structure 310 may include a first surface 311, and a second surface 312 facing a direction that is opposite to the first surface 311, and the second housing structure 320 may include a third surface 321, and a fourth surface 322 facing a direction that is opposite to the third surface 321.

According to various embodiments, the display 200 may be viewed from the outside through at least one surface of the foldable housing 300, and may extend from the first surface 311 of the first housing structure 310 (or the upper side of the first surface 311) to the third surface 321 of the second housing structure 320 (or the lower side of the third surface 321).

According to various embodiments, the first housing structure 310 may include a first side surface 313 connected to the hinge structure 330 and being parallel to the axis of rotation (e.g., the axis A of rotation of FIG. 2) of the hinge structure 330, a second side surface 314 facing a direction that is opposite to the first side surface 313, and a third side surface 315 that is perpendicular to the axis A of rotation of the hinge structure 330.

According to various embodiments, the second housing structure 320 may include a fourth side surface 323 connected to the hinge structure 330 and being parallel to the axis of rotation (e.g., the axis A of rotation of FIG. 2) of the hinge structure 330, a fifth side surface 324 facing a direction that is opposite to the fourth side surface 323, and a sixth side surface 325 that is perpendicular to the axis A of rotation of the hinge structure 330.

According to various embodiments, the first housing structure 310 may include a first rotation support surface 316, and the second housing structure 320 may include a second rotation support surface 326 corresponding to the first rotation support surface 316. The first rotation support surface 316 and the second rotation support surface 326 may include curved surfaces corresponding to the curved surface included in the hinge cover 331.

In an embodiment, the first rotation support surface 316 and the second rotation support surface 326 may cover the hinge cover 331 such that the hinge cover 331 is not exposed to the rear surface of the electronic device 101 or is exposed minimally when the electronic device 101 is in the unfolding status (e.g., the electronic device of FIG. 2). As another embodiment, the first rotation support surface 316 and the second rotation support surface 326 may be rotated along a curved surface included in the hinge cover 331 such that the hinge cover 331 is maximally exposed to the rear surface of the electronic device 101 when the electronic device 101 is in the folding status (e.g., the electronic device of FIG. 3).

Figure 5A:
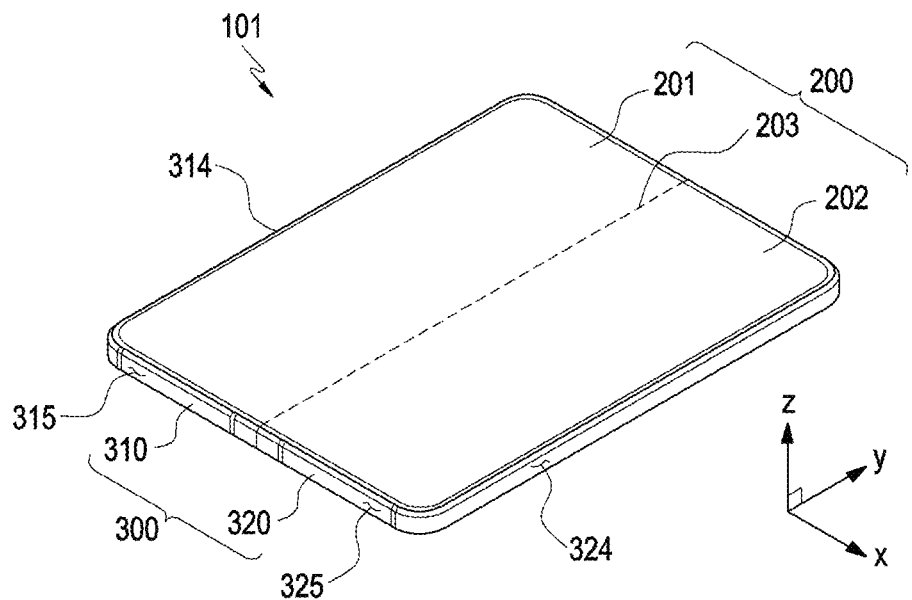
FIGS. 5A-5B are perspective views illustrating an example of an unfolding status, in which an electronic device is fully unfolded, or an intermediate status, in which the electronic device is partially unfolded, according to some embodiments.
Figure 5B:
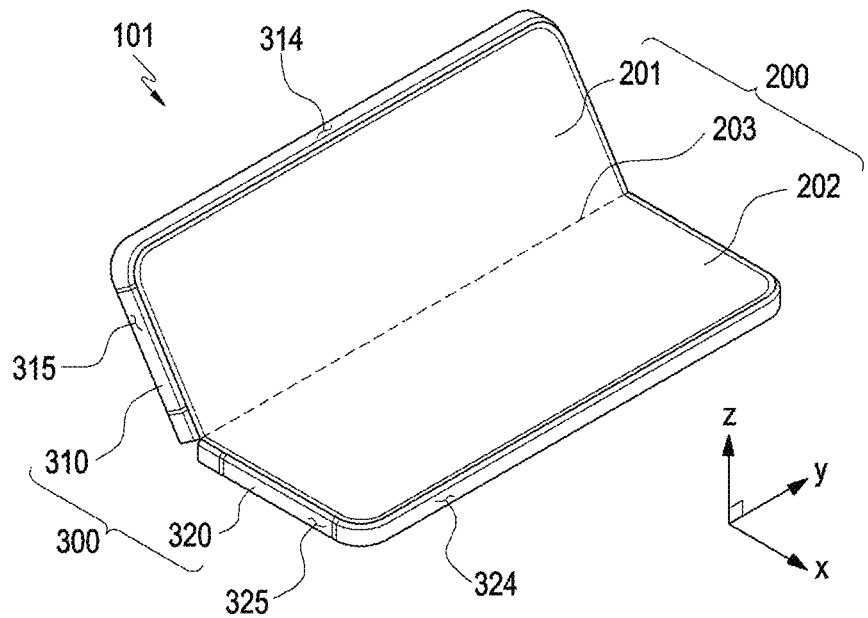

FIGS. 5A-B are a perspective views illustrating an example of a status in which the electronic device 101 is fully unfolded or an intermediate status in which the electronic device 101 is partially unfolded according to some embodiments. In detail, FIG. 5A may illustrate a complete unfolding status of the electronic device 101, and FIG. 5B may illustrate an intermediate status in which the electronic device 101 is partially unfolded. Referring to FIGS. 5A-5B, the electronic device 101 may include a foldable housing 300 and a flexible display 200. The status of the electronic device 101 may be changed to a folding status or an unfolding status. When viewed from the hinge axis direction (e.g., a direction that is parallel to the y axis), the electronic device 101 may be folded in two types of an 'in-folding' type in which the front surface of the electronic device 101 is folded to define an acute angle and an 'out-folding' type in which the front surface of the electronic device 101 is folded to define an obtuse angle. For example, in the status (the folding status) in which the electronic device is folded in the in-folding type, the first surface (e.g., 311 of FIG. 4) may face the third surface (e.g., 321 of FIG. 4), and the third direction may be the same as the first direction in the complete unfolding status. As another example, in the status in which the electronic device 101 is folded in the out-folding type, the second surface (e.g., 312 of FIG. 4) may face the fourth surface (e.g., 322 of FIG. 4).

The in-folding type may refer to a status in which the flexible display 200 is not exposed to the outside in the full folding status. The out-folding type may refer to a status in which the flexible display 200 is exposed to the outside in the full folding status. FIG. 5B illustrates an intermediate status in which the electronic device 101 is partially unfolded in the in-folding process.

Although the status in which the electronic device 101 is folded in the in-folding type will be described below for convenience's sake, it should be noted that the description may be similarly applied in the status in which the electronic device 101 is folded in the out-folding type.

According to various embodiments, the flexible display 200, for example, has a rectangular shape, the corners of which are rounded, and the bezel areas around the flexible display 200 may have very narrow forms.

The flexible display 200 may include a first area 201 disposed in the first housing structure 310 and a second area 202 disposed in the second housing structure 320, and the first area 201 and the second area 202 may have the same shape. The first area 201 and the second area 202 of the electronic device 101 may be divided while the folding area 203 is taken as the border therebetween.

The configurations of the electronic device 101 of FIGS. 1 to 4 may be similarly applied to the other configurations of the electronic device 101 of FIGS. 5A-5B.

The user may perform an input to the first area 201 or the second area 202 illustrated in FIGS. 5A-5B through a portion (e.g., a hand) of the body or may perform an input by using an input device (e.g., 150 of FIG. 1).

Figure 6:
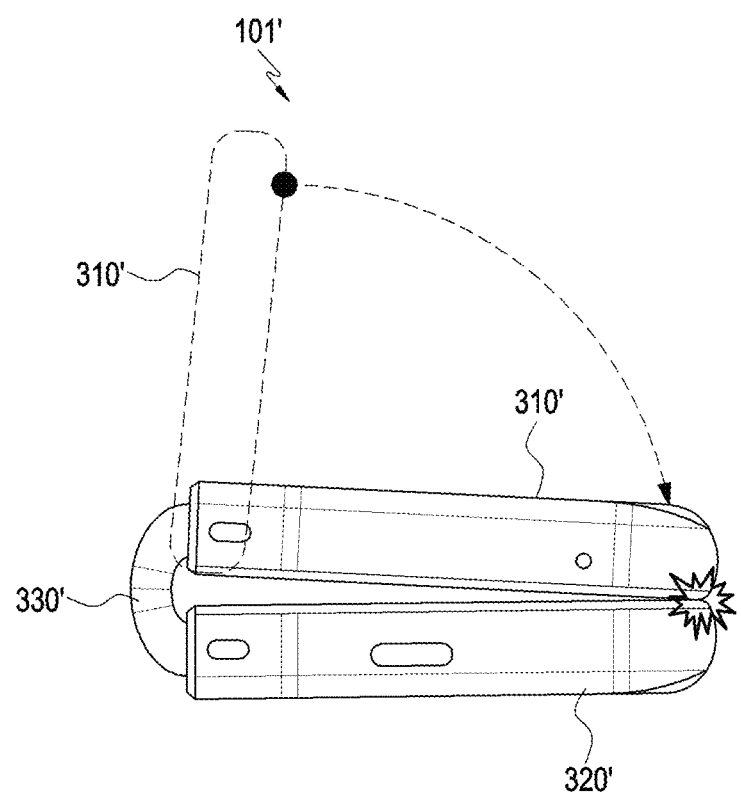
FIG. 6 is a view illustrating a state in which a first housing structure of an electronic device contacts a second housing structure according to some embodiments.

FIG. 6 is a view illustrating a state in which a first housing structure 310' of an electronic device 101' contacts a second housing structure 320' according to some embodiments. According to some embodiments, a damper member such as rubber may be provided on a contact surface of the first housing structure 310' and the second housing structure 320' to prevent damage to an external appearance of the electronic device 101' due to a physical impact during a contact of the first housing structure 310' and the second housing structure 320'. If the bezel area becomes narrower to provide a display 200 having a wider display area, it may become very difficult to form the damper on the surface of the electronic device as an adverse effect.

Figure 7:
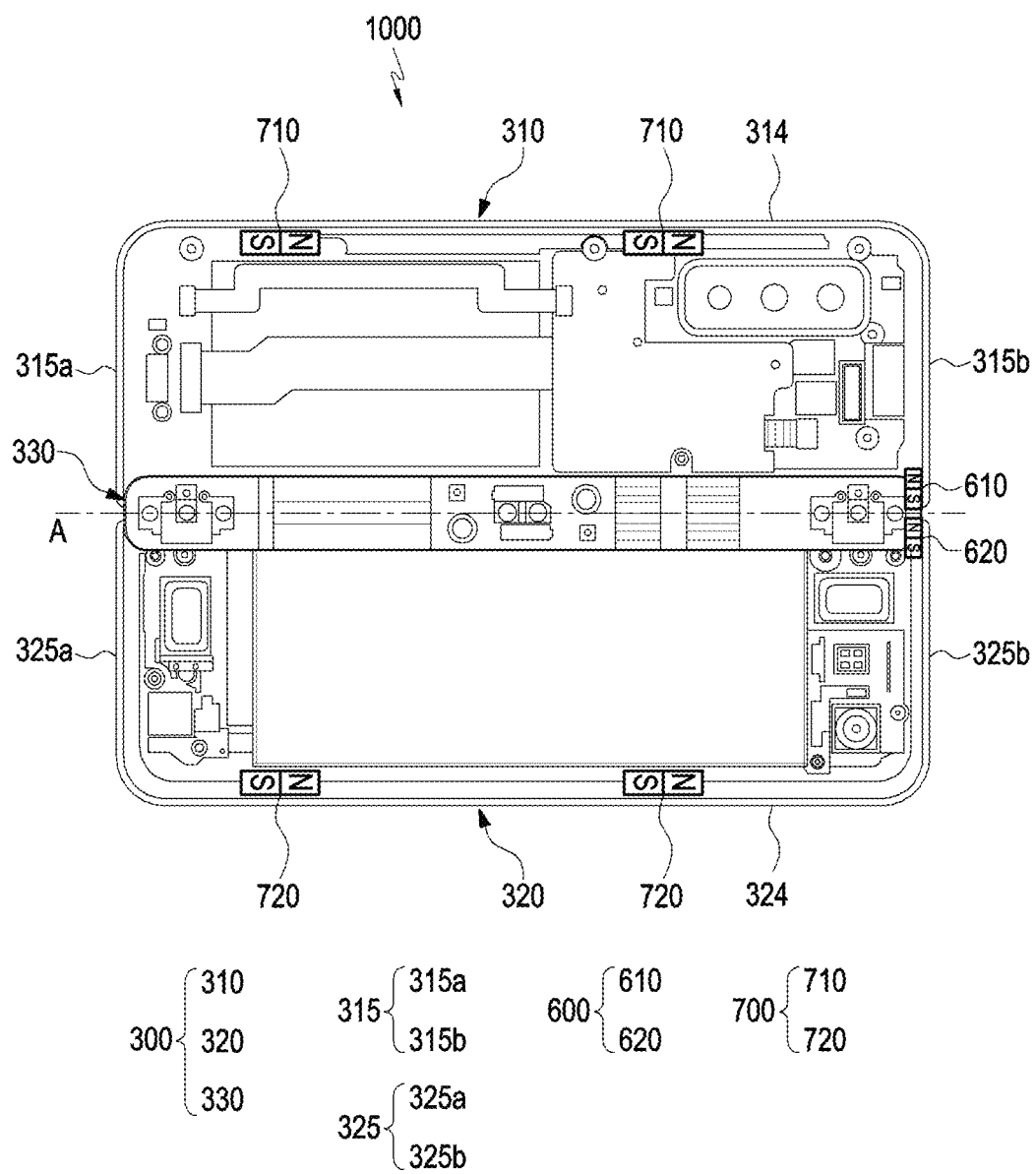
FIG. 7 is a view schematically illustrating arrangement of various components included in an electronic device according to various embodiments of the disclosure.

FIG. 7 is a view schematically illustrating arrangement of various components included in an electronic device 1000 according to various embodiments of the disclosure.

An electronic device 1000 (e.g., the electronic device 101 of FIG. 1) according to various embodiments of the disclosure may further include a foldable housing 300 including a hinge structure 330, a first housing structure 310 connected to the hinge structure 330, and a second housing structure 320 connected to the hinge structure 330 and being foldable with the first housing structure 310 about the hinge structure, a flexible display (e.g., the display 200 of FIG. 2), a locker & closer 600, and a damper member 700.

In the embodiment illustrated in FIG. 7, the display (e.g., the display 200 of FIG. 2) may be disposed over the first housing structure 310 and the second housing structure 320. However, the status is not illustrated in the drawing, and various components disposed on the rear surface of the display are schematically illustrated. The components according to the embodiment illustrated in FIG. 7 are simple examples, and the electronic device 1000 disclosed in the disclosure may have various arrangement forms and configurations of components, which are different from the embodiment illustrated in FIG. 7.

The locker & closer 600 included in the electronic device 1000 may maintain the unfolding status of the foldable housing 300 against an external force of a first threshold external force or less, or may bring the foldable housing 300 into a folding status when an external force of a second threshold external force or more is applied or the folding angle between the first housing structure 310 and the second housing structure 320 is smaller than a specific angle. According to an embodiment, in order to maintain the unfolding status of the foldable housing 300, the locker & closer 600 may have a structure and a shape that resist a physical external force applied to the foldable housing 300 or have a resistant force that is higher than the physical external force to maintain the shape of the foldable housing 300. For example, the locker & closer 600 may be a structure (e.g., a cam structure) for maintaining a full unfolding status of the foldable housing 300. As another example, the locker & closer 600 is a member having a magnetic property, and may be a configuration of maintaining the unfolding status of the foldable housing 300 through an operation of a magnetic force that is higher than an external force. For example, when an external force (e.g., 10 F, in the following description, 'F' is a symbol of a force and may refer to a unit of a force, that is, 'N (newton)') of a first threshold external force or less is applied to the foldable housing 300 in the unfolding status of the foldable housing 300, the locker & closer 600 may provide a force against the external force such that the foldable housing 300 maintains the unfolding status. Meanwhile, if an external force (e.g., 15F) that exceeds the first threshold external force (e.g., 10F) is applied to the foldable housing 300 in the unfolding status of the foldable housing 300, the lock function of the locker & closer 600 may be released and the foldable housing 300 may be folded.

According to an embodiment, the first threshold force may be an impact force that is applied to the electronic device 1000 at a certain time point, but according to another embodiment, the first threshold external force may be a force that is cumulatively applied to the electronic device 1000. The above description may be similarly applied to the second threshold external force.

According to another embodiment, the locker & closer 600 may have a structure and a shape, by which the foldable housing 300 is folded. According to an embodiment, the locker & closer 600 may be a structure (e.g., a cam structure) that generates a resistant force, by which the foldable housing 300 is folded, when a very high physical external force (e.g., an external force of the second threshold external force or more) is applied or an folding angle between the first housing structure 310 and the second housing structure 320 is smaller than a specific angle. For example, if an external force (e.g., 40 F) of the second threshold external force (e.g., 30 F) or more is applied to the foldable housing 300 when the foldable housing 300 is in the unfolding status or is in the intermediate status, in which the foldable housing 300 is partially unfolded, the locker & closer 600 may perform a function of narrowing the distance between the first housing structure 310 and the second housing structure 320. According to another embodiment, the locker & closer 600 may be a structure that is a member having a magnetic property and folds the foldable housing 300 by a resistant force generated by a magnetic operation, when a very high physical external force (e.g., an external force of the second threshold external force or more) is applied or a folding angle between the first housing structure 310 and the second housing structure 320 is smaller than a specific angle. For example, when the folding angle between the first housing structure 310 and the second housing structure 320 is smaller than a specific angle in the intermediate status, in which the foldable housing 300 is partially unfolded, the foldable housing 300 may be unfolded by an attractive force according to the magnetic property of the locker & closer without using an external force.

According to various embodiments, the locker & closer 600 according to various embodiments of the disclosure, as illustrated in FIG. 7, may include a first locker & closer 610 disposed in the interior of the first housing structure 310, and a second locker & closer 620 disposed in the interior of the second housing structure 320 and disposed at a location that is symmetrical to the first locker & closer 610 with respect to the hinge structure 330. According to various embodiments, at least a portion of the first locker & closer 610 and at least a portion of the second locker & closer 620 may be disposed in the hinge cover (e.g., the hinge cover 331 of FIG. 3).

Referring to FIG. 7, the first housing structure 310 of the electronic device 1000 may include a first side surface (e.g., the first side surface 313 of FIG. 4) connected to the axis A of rotation of the hinge structure 330 and being parallel to the axis A of rotation of the hinge structure 330, a second side surface 314 facing a direction that is opposite to the first side surface 313, and a third side surface 315 that is perpendicular to the first axis A of rotation. Here, the third side surface 315 may be divided into a (3-1)-th side surface 315a and a (3-2)-th side surface 315b. The second housing structure 320 of the electronic device 1000 may include a fourth side surface (e.g., the fourth side surface 323 of FIG. 4) connected to the hinge structure 330 and being parallel to the first axis A of rotation of the hinge structure 330, a fifth side surface 324 facing a direction that is opposite to the fourth side surface 323, and a sixth side surface 325 that is perpendicular to the axis A of rotation. Here, the sixth side surface 325 may be divided into a (6-1)-th side surface 325a and a (6-2)-th side surface 325b.

According to the embodiment illustrated in FIG. 7, the first locker & closer 610 may be disposed on the third side surface to be adjacent to the hinge structure 330, and the second locker & closer 620 may be disposed on the sixth side surface 325 to be adjacent to the hinge structure 330.

The locker & closer 600 according to various embodiments of the disclosure may include a first locker & closer 610 and a second locker & closer 620 and a force may be generated by an interaction between the first locker & closer 610 and the second locker & closer 620 during the movement (or rotation) of the hinge structure 330, and accordingly, the unfolding status of the foldable housing 300 may be maintained or the foldable housing 300 may be folded.

According to various embodiments of the disclosure, the electronic device 1000 may further include a damper member 700 disposed in the interior of the foldable housing 300. For example, the electronic device 1000 referenced in FIG. 7 may include a first damper member 710 in the interior of the first housing structure 310, and may include a second damper member 720 in the interior of the second housing structure 320. In addition, a detailed description of the damper member 700 may be described with reference to FIGS. 10 to 15.

Figure 8:
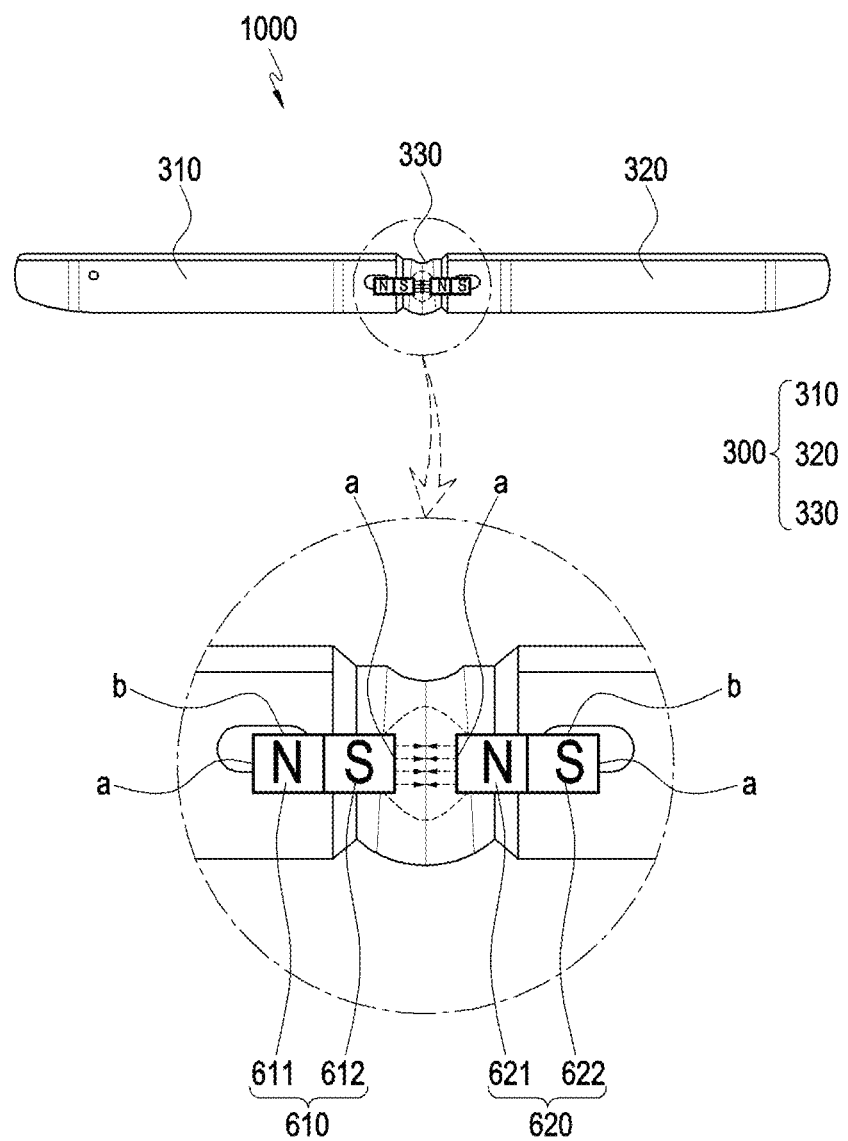
FIG. 8 is a view illustrating an interaction of a first locker & closer and a second locker & closer including a magnetic substance in an unfolding status of an electronic device according to various embodiments of the disclosure.
Figure 9:
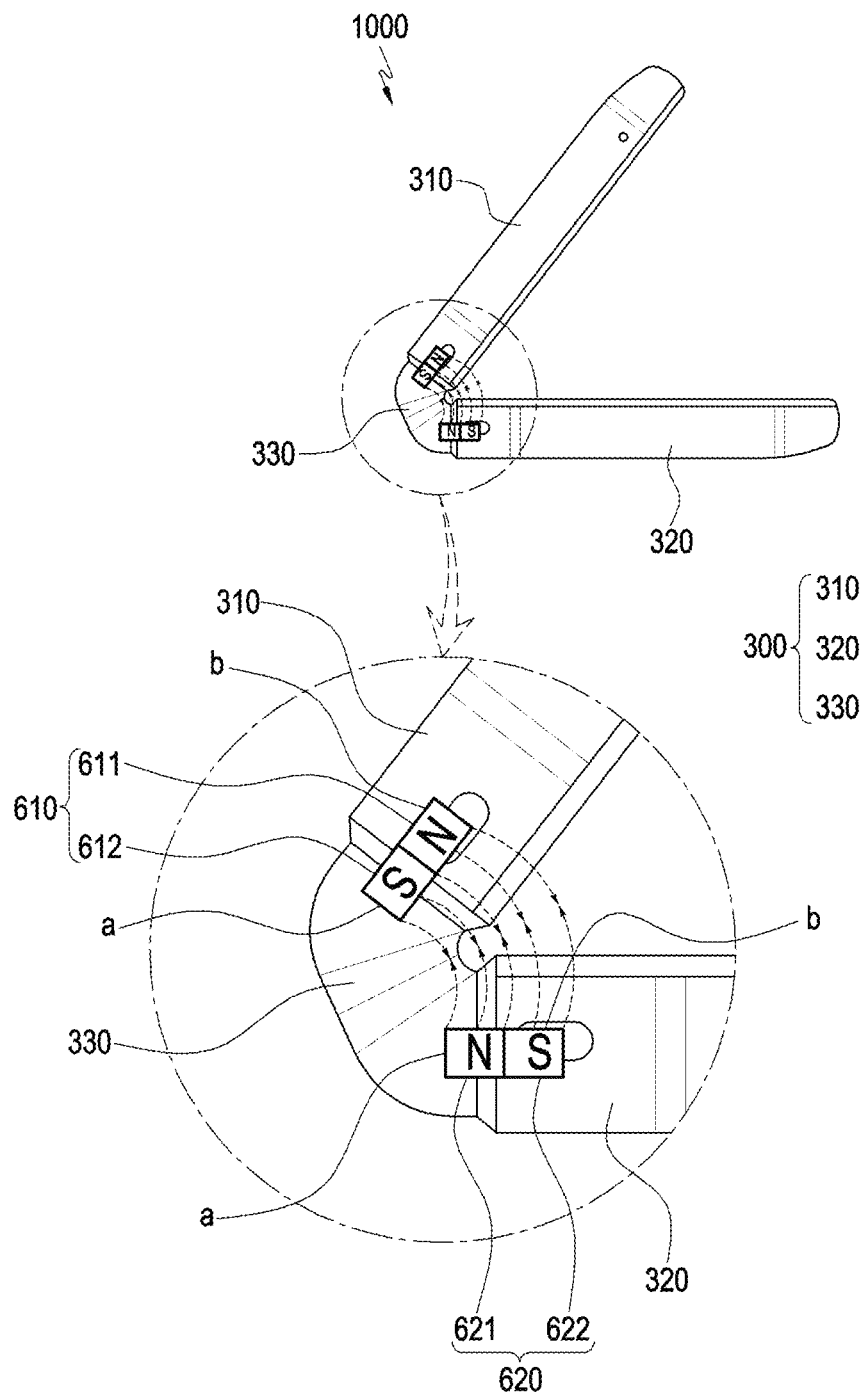
FIG. 9 is a view illustrating an interaction of a first locker & closer and a second locker & closer including a magnetic substance in an intermediate status, in which an electronic device is partially folded, according to various embodiments of the disclosure.

FIG. 8 is a view illustrating an interaction of a first locker & closer 610 and a second locker & closer 620 including a magnetic substance in an unfolding status of an electronic device 1000 according to various embodiments of the disclosure. FIG. 9 is a view illustrating an interaction of a first locker & closer 610 and a second locker & closer 620 including a magnetic substance in an intermediate status, in which an electronic device 1000 is partially folded, according to various embodiments of the disclosure.

According to various embodiments, each of the first locker & closer 610 and the second locker & closer 620 may include a magnetic substance. According to an embodiment, opposite poles of the first locker & closer 610 and the second locker & closer 620 may be disposed to face a direction that is perpendicular to the axis of rotation (e.g., the axis A of rotation of FIG. 7), and the first locker & closer 610 and the second locker & closer 620 may be configured such that the opposite poles thereof face each other in the unfolding status or the folding status of the foldable housing 300.

Referring to FIGS. 8 and 9 together, in the full unfolding status of the foldable housing 300, the first locker & closer 610 may be disposed in parallel to the lengthwise direction of the first housing structure 310 having the shape of a flat plate, and the second locker & closer 620 may be disposed in parallel to the lengthwise direction of the second housing structure 320 having the shape of a flat plate. In this status, the first locker & closer 610 and the second locker & closer 620 may be fixedly installed in the first housing structure 310 and the second housing structure 320, respectively.

For example, a first pole 611 of the first locker & closer 610 may face one end (e.g., the second side surface 314 of FIG. 7) of the first housing structure 310, and a second pole 612 of the first locker & closer 610 may be fixedly installed in the first housing structure 310 in a status in which the second pole 612 faces a direction that is perpendicular to the axis of rotation (e.g., the axis A of rotation of FIG. 7) as an opposite direction of the first pole 611. A third pole 622 of the second locker & closer 620 may face one end (e.g., the fifth side surface 324 of FIG. 7) of the second housing structure 320, and a fourth pole 621 of the second locker & closer 620 may be fixedly installed in the first housing structure 310 in a status in which the fourth pole 621 faces a direction that is perpendicular to the axis of rotation (e.g., the axis A of rotation of FIG. 7) as an opposite direction of the third pole 622.

As another example, when the first locker & closer 610 has the form of a bar magnet, a short side a of the first locker & closer 610 may face a direction that is perpendicular to one end (e.g., the second side surface 314 of FIG. 7) of the first housing structure 310 and the axis of rotation (e.g., the axis A of rotation of FIG. 7), and the long side b thereof may be fixedly installed to face the first surface (e.g., the first surface 311 of FIG. 4) or the second surface (e.g., the second surface 312 of FIG. 4) of the first housing structure 310. For example, the description that the short side a (or the long side b) faces a certain direction may mean that a line that is normal to the corresponding side faces the direction. As an example, the description that the long side b faces the first surface (e.g., the first surface 311 of FIG. 4) of the first housing structure 310 may mean that the long side faces the first surface (e.g., the first surface 311 of FIG. 4). According to an embodiment, the second locker & closer 620 also has the form of a bar magnet when the first locker & closer 610 has the form of a bar magnet, whereby a short side a of the second locker & closer 620 may face a direction that is perpendicular to one end (e.g., the fifth side surface 324 of FIG. 7) of the second housing structure 320 and the axis of rotation (e.g., the axis A of rotation of FIG. 7), and the long side b thereof may be fixedly installed to face the third surface (e.g., the third surface 321 of FIG. 7) or the fourth surface (e.g., the fourth surface 322 of FIG. 7) of the second housing structure 320.

As illustrated in FIG. 8, in the unfolding status of the foldable housing 300, the first locker & closer 610 and the second locker & closer 620 may be located at the same level from one surface (e.g., the second surface 312 and/or the fourth surface 322 of FIG. 4) of the foldable housing 300. In the unfolding status of the foldable housing 300, the opposite poles of the first locker & closer 610 and the second locker & closer 620 may face each other, and a force that pulls the first locker & closer 610 and the second locker & closer 620 may be generated. Through this, because the distance between the first housing structure 310 and the second housing structure 320 is made to become closer or is maintained, the unfolding status of the foldable housing 300 may be maintained even though an external force of a first threshold external force or less is applied to the foldable housing 300.

Referring to FIG. 9, in the intermediate status in which the electronic device 1000 is partially folded, the first locker & closer 610 and the second locker & closer 620 may be disposed at locations that are inclined with respect to each other. Referring to FIG. 8 again, because the opposite poles of the short sides a the first locker & closer 610 and the second locker & closer 620 face each other at the same level, the magnetic flux extending from the short side a of the first locker & closer 610 may be connected to the short side a of the second locker & closer 620 in a line. Unlike this, in the embodiment illustrated in FIG. 9, the long side b of the first locker & closer 610 and the long side b of the second locker & closer 620 may face each other in the process of folding the electronic device 1000, the magnetic flux extending from the long side b of the first locker & closer 610 may be connected to the long side b of the second locker & closer 620. According to the embodiment illustrated in FIG. 9, because the facing long sides b of the first locker & closer 610 and the second locker & closer 620 have opposite poles, an attractive force may be applied.

According to an embodiment, the foldable housing 300 may be folded when an external force of the second threshold external force or more is applied to the electronic device 1000 or the foldable housing 300 may be folded when the angle between the first housing structure 310 and the second housing structure 320 is a specific angle or less. Accordingly, the attractive force between the first locker & closer 610 and the second locker & closer 620 may gradually increase. According to an embodiment, even though an operation of the external force is stopped, the folding operation may be progressed by the attractive force between the first locker & closer 610 and the second locker & closer 620.

Figure 10:
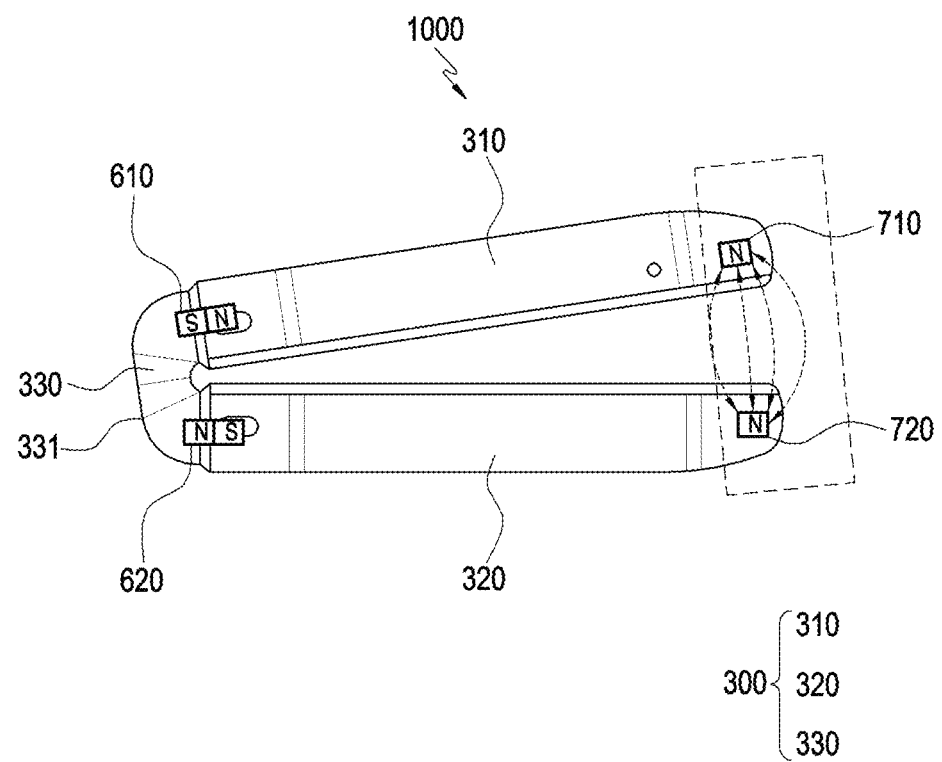
FIG. 10 is a view illustrating an interaction of a first damper member and a second damper member, in an intermediate status in which an electronic device is partially folded, according to various embodiments of the disclosure.
Figure 11A:
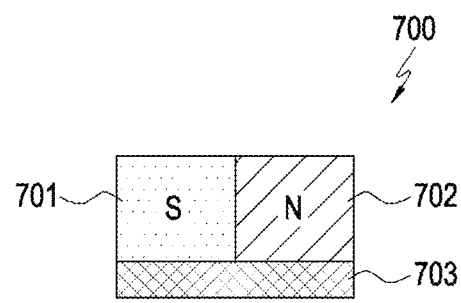
FIGS. 11A-11D are views illustrating a magnetic substance and a shield member that surrounds at least a portion of the magnetic substance according to various embodiments of the disclosure.
Figure 11B:
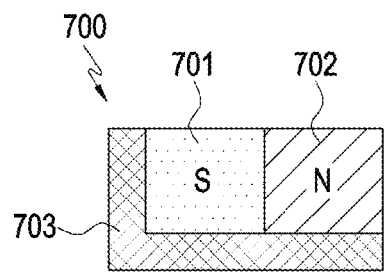
Figure 11C:
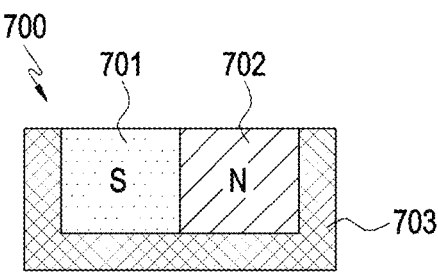
Figure 11D:
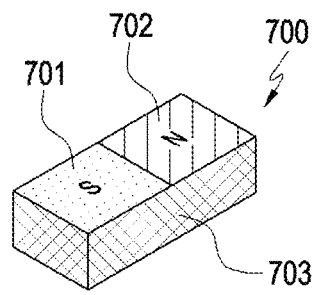

FIG. 10 is a view illustrating an interaction of a first damper member 710 and a second damper member 720, in an intermediate status in which an electronic device is partially folded, according to various embodiments of the disclosure.

Referring to FIGS. 7 and 10 together, the electronic device 1000 according to various embodiments of the disclosure may further include a damper member 700 together with the locker & closer 600. The damper member 700 may be disposed at a location that is farther than the locker & closer 600 with reference to the hinge structure 330. For example, according to an embodiment illustrated in FIGS. 7 and 10, the first damper member 710 may be disposed at a location that is farther than the first locker & closer 610 with reference to the hinge structure 330, and the second damper member 720 also may be disposed at a location that is farther than the second locker & closer 620 with reference to the hinge structure 330.

Here, the damper member 700 may be a member including a magnetic substance. Further, the second damper member 720 may be disposed at a location that is symmetrical to the first damper member 710 with respect to the hinge structure. If the second damper member 720 is disposed at a location that is symmetrical to the first damper member 710 with respect to the hinge structure when each of the first damper member 710 and the second damper member 720 includes a magnetic substance, an impact generated when the first housing structure 310 and the second housing structure 320 contact each other through a mutual operation (e.g., generation of a repulsive force) between the first damper member 710 and the second damper member 720 can be alleviated.

According to an embodiment, the damper member 700 may be disposed at a location that is spaced apart from a surface of the foldable housing 300 toward a space in the interior of the foldable housing 300 by a predetermined distance. The damper member 700 may be disposed on the surface of the foldable housing 300 to prevent the external appearance of the electronic device 1000 from degrading, and it is advantageous in an aspect of the degree of freedom of design to dispose the damper member 700 in the interior space of the foldable housing 300 than to dispose the damper member 700 on the surface of the foldable housing 300.

Referring to FIGS. 7 and 10, the first damper member 710 and the second damper member 720 may be disposed on the second side surface 314 of the first housing structure 310 that is parallel to the axis A of rotation and the fifth side surface 324 of the second housing structure 320, respectively. According to various embodiments, the first damper member 710 and the second damper member 720 may be disposed at locations that are symmetrical to each other with respect to the axis A of rotation, and may be disposed such that the adjacent ends thereof have the same pole. Accordingly, when the first damper member 710 and the second damper member 720 become closer, a repulsive force may be generated between them. Then, the folding angle of the foldable housing 300 becomes smaller, a repulsive force due to the same pole is generated between the first damper member 710 and the second damper member 720. In this case, because the repulsive force is small when the folding angle is larger but the repulsive force generated between the first damper member 710 and the second damper member 720 becomes gradually larger as the folding angle becomes gradually smaller, an impact can be absorbed when the first housing structure 310 and the second housing structure 320 collide with each other.

FIGS. 11A-11D are views illustrating a magnetic substance and a shield member that surrounds at least a portion of the magnetic substance according to various embodiments of the disclosure. Here, the magnetic substance may be included in the locker & closer 600 or the damper member 700 illustrated in FIG. 7. FIGS. 11A-11D may illustrate, as an example, that at least a portion of the damper member 700 corresponds to a magnetic substance.

According to an embodiment, at least a portion of the damper member 700 may include a magnetic substance. The damper member 700 is a magnetic substance including one pole 701 and an opposite pole 720, and may be disposed in the electronic device (e.g., the electronic device 1000 of FIG. 7) while having a directional property to maximize a magnetic operation according the shortening of the distance from another damper member 700. For example, as illustrated in FIG. 7, the one pole 701 and the opposite pole 702 of the first damper member 710 and the second damper member 720 may be disposed in parallel to the axis A of rotation.

According to various embodiments, the damper member 700 may further include a shield structure 703 that surrounds at least a portion of the one pole 701 and the opposite pole 702. The shield structure 703, as illustrated in FIGS. 11A, 11B, 11C, and 11D, may surround various surfaces of the magnetic substance portion of the damper member 700. The shield structure 703, in addition to the embodiments of FIGS. 11A, 11B, 11C, and 11D, may be disposed in other various locations around the damper member 700.

Figure 12:
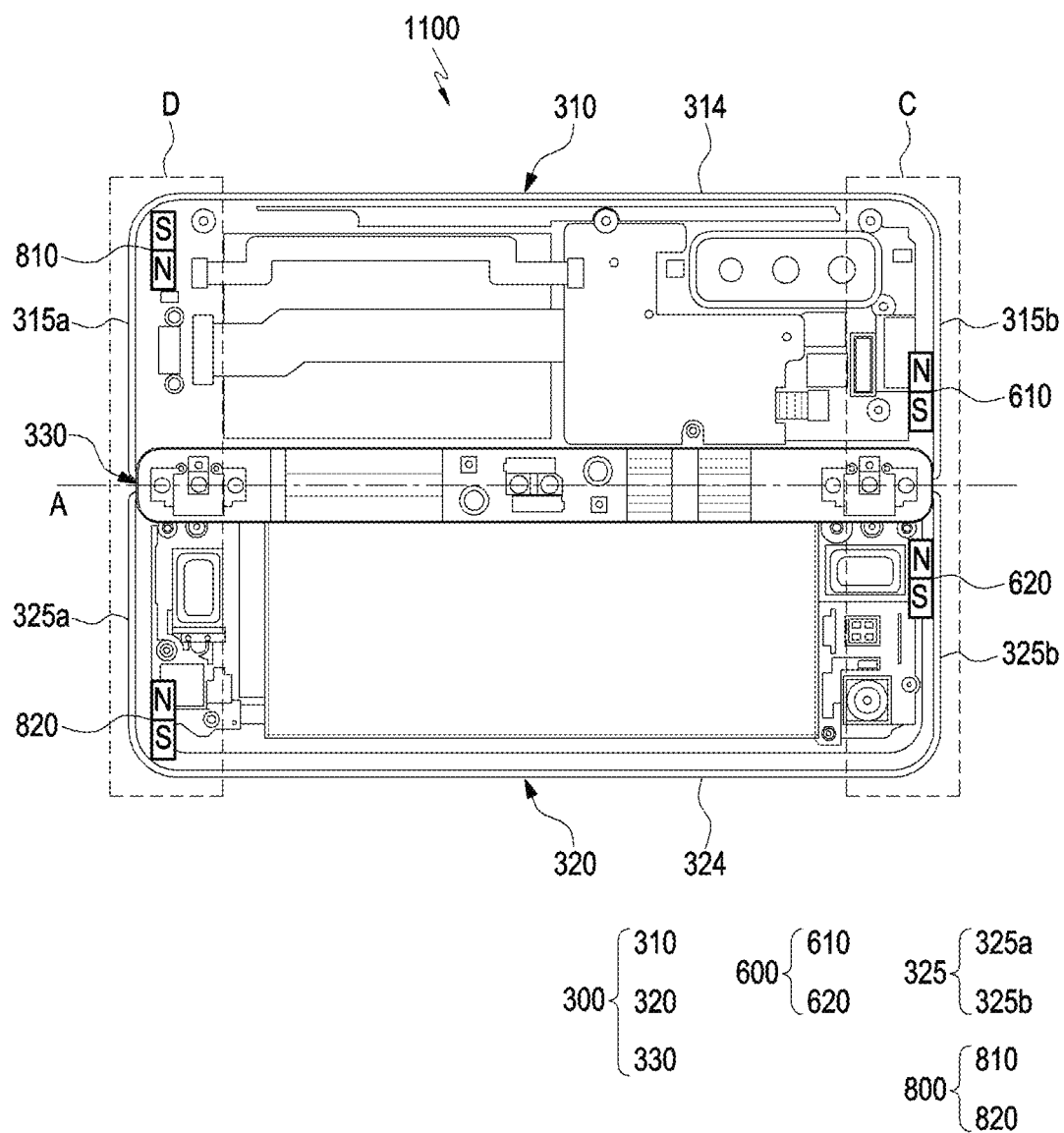
FIG. 12 is a view schematically illustrating arrangement of various components included in an electronic device according to an embodiment of the disclosure, which is different from that of FIG. 7.
Figure 13:
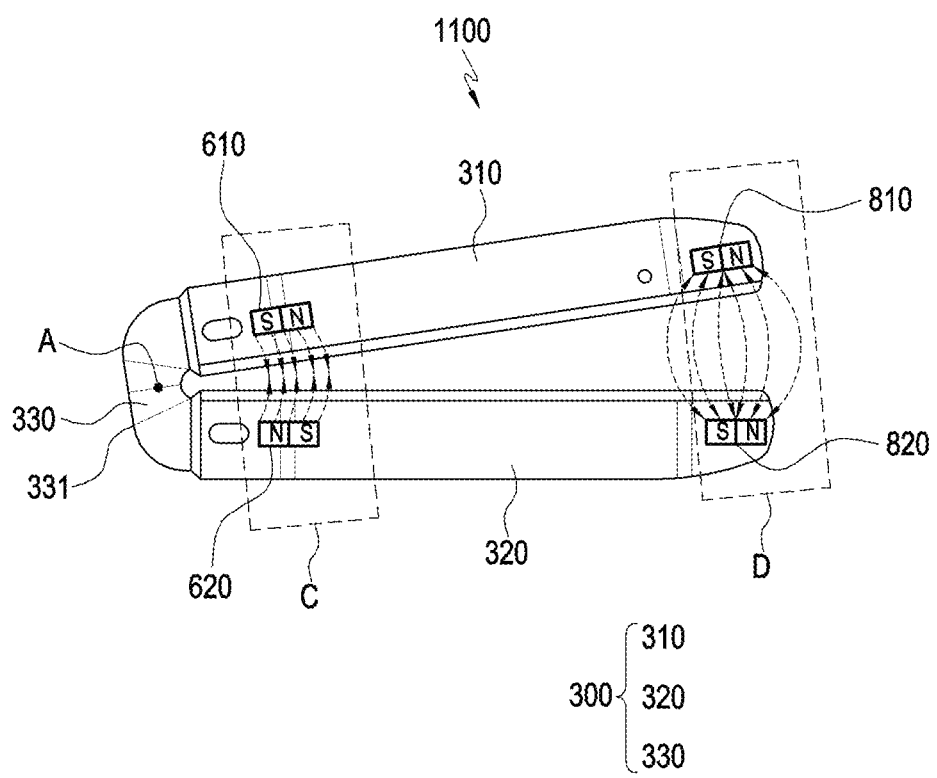
FIG. 13 is a view illustrating an interaction of first and second locker & closers and first and second damper members according to the embodiment illustrated in FIG. 12.

FIG. 12 is a view schematically illustrating arrangement of various components included in an electronic device 1100 according to an embodiment of the disclosure, which is different from that of FIG. 7. FIG. 13 is a view illustrating an interaction of first and second locker & closers 610 and 620 and first and second damper members 810 and 820 according to the embodiment illustrated in FIG. 12. In the embodiment illustrated in FIG. 12, the first and second locker & closers 610 and 620 are disposed on one side C of the electronic device 1100 and the first and second damper members 810 and 820 are disposed on the opposite sides D of the electronic device 1100, but it should be noted that they may be displayed on one section for convenience of description in FIG. 13.

An electronic device 1100 (e.g., the electronic device 101 of FIG. 1) according to various embodiments of the disclosure may further include a foldable housing 300 including a hinge structure 330, a first housing structure 310 connected to the hinge structure 330, and a second housing structure 320 connected to the hinge structure 330 and being foldable with the first housing structure 310 about the hinge structure 330, a flexible display (e.g., the display 200 of FIG. 2), a locker & closer 600, and a damper member 800. In the description of the embodiment of FIG. 12, the repeated contents of FIG. 7 will be omitted.

Unlike that at least a portion of the locker & closer 600 illustrated in FIG. 7 is disposed in the hinge cover (e.g., 331 of FIG. 3), the locker & closer 600 illustrated in FIG. 12 may be disposed at a location that is further spaced apart from the hinge axis A by a predetermined distance. As illustrated in FIG. 12, the location of the locker & closer 600 may be variously set along the side surface (e.g., the third side surface 315 and the sixth side surface 325) of the foldable housing 300, and the interval of the operation time points of the open lock function and the closing function may be adjusted through adjustment of the location of the locker & closer 600. For example, the locker & closer 600 illustrated in FIG. 12 may have a relatively wide operation time point interval as compared with the locker & closer 600 illustrated in FIG. 7.

Unlike in the embodiment illustrated in FIG. 7, according to the embodiment illustrated in FIG. 12, the first damper member 810 may be disposed on the third side surface 315 and the second damper member 820 may be disposed on the sixth side surface 325. According to an embodiment, the third side surface 315 may include a (3-1)-th side surface 315a on one side of the first housing structure 310 and a (3-2)-th side surface 315b on an opposite side of the first housing structure 310, and the sixth side surface 325 may include a (6-1)-th side surface 325a on one side of the second housing structure 320 and a (6-2)-th side surface 325b on an opposite side of the second housing structure 320. For example, the first damper member 810 may be disposed on the (3-1)-th side surface 315a, and the second damper member 820 may be disposed on the (6-1)-th side surface 325a.

According to various embodiments, the locker & closer 600 may be disposed in correspondence to the locations at which the first damper member 810 and the second damper member 820 are disposed. For example, the first locker & closer 610 may be disposed on the (3-2)-th side surface 315b that is opposite to the side surface, on which the first damper member 810 is disposed, and the second locker & closer 620 may be disposed on the (6-2)-th side surface 325b that is opposite to the side surface, on which the second damper member 820 is disposed. Of course, the above-described embodiment is a simple embodiment, and the first damper member 810 and the second damper member 820 may be disposed on the (3-2)-th side surface 315b and the (6-2)-th side surface 325b, respectively, and the first locker & closer 610 and the second locker & closer 620 may be disposed on the (3-1)-th side surface 315a and the (6-1)-th side surface 325a, respectively. Meanwhile, it may be advantageous to locate the locker & closer 600 at a location that is at least opposite to the damper member 800 to prevent torsion of the electronic device 1100 when the electronic device 1100 is folded and unfolded.

According to various embodiments, the electronic device 1000 and 1100 according to the embodiments illustrated in FIGS. 7 and 12 may include a plurality of first damper members 710 and 810 and a plurality of second damper members 720 and 820. For example, as illustrated in FIG. 7, the plurality of first damper members 710 may be disposed on the second side surface 314 of the first housing structure 310, and the plurality of second damper members 720 may be disposed at locations corresponding to the plurality of first damper members 710 on the fifth side surface 324 of the second housing structure 320. Here, the second damper members 720 may have the same poles as the poles of the first damper members 710 such that a repulsive force may be generated between them when the second damper members 720 become closer to the first damper members 710.

Figure 14:
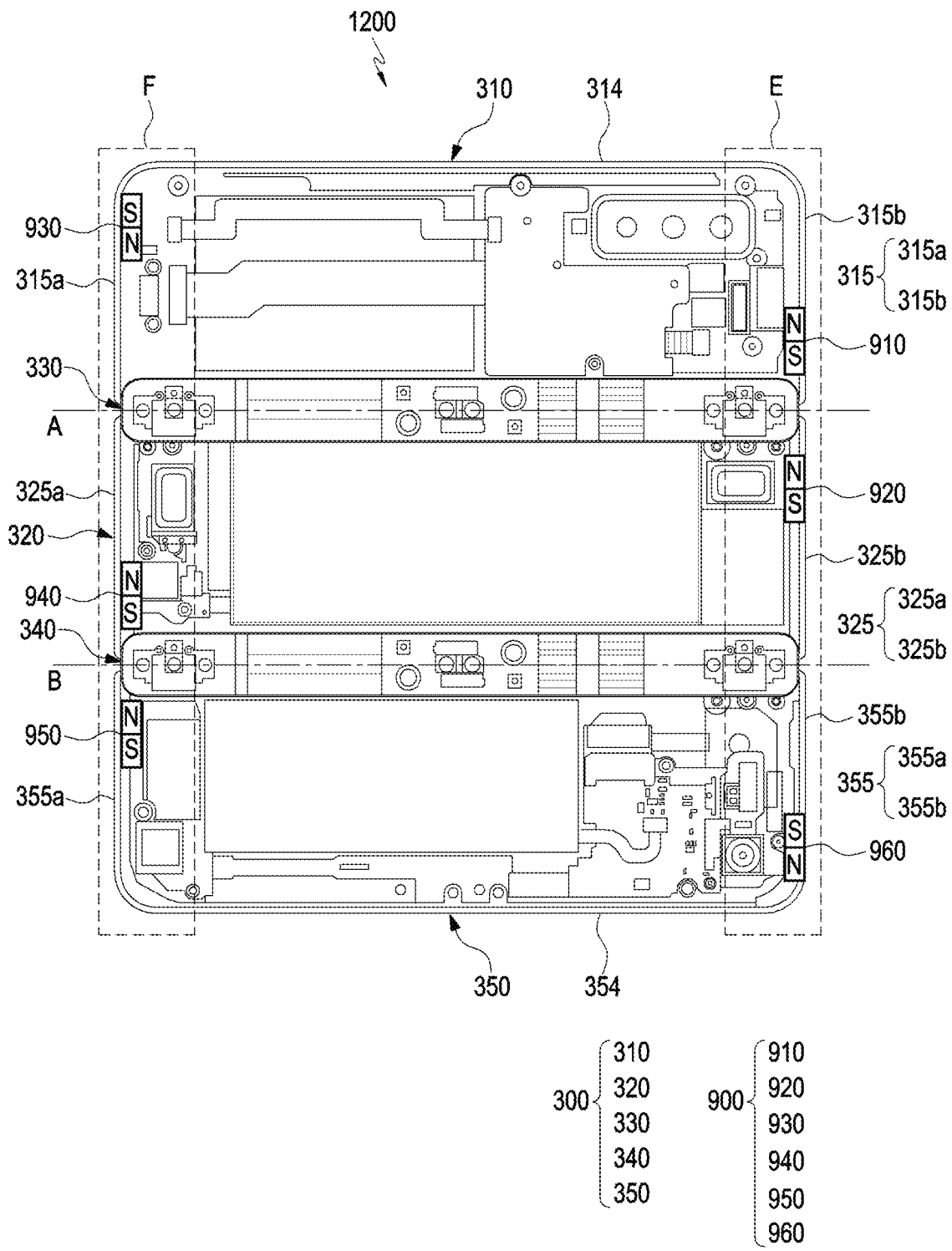
FIG. 14 is a view schematically illustrating a dual foldable electronic device (or a 3-step foldable electronic device) and arrangement of various components included in the dual foldable electronic device according to an embodiment that is different from that of FIG. 7.
Figure 15:
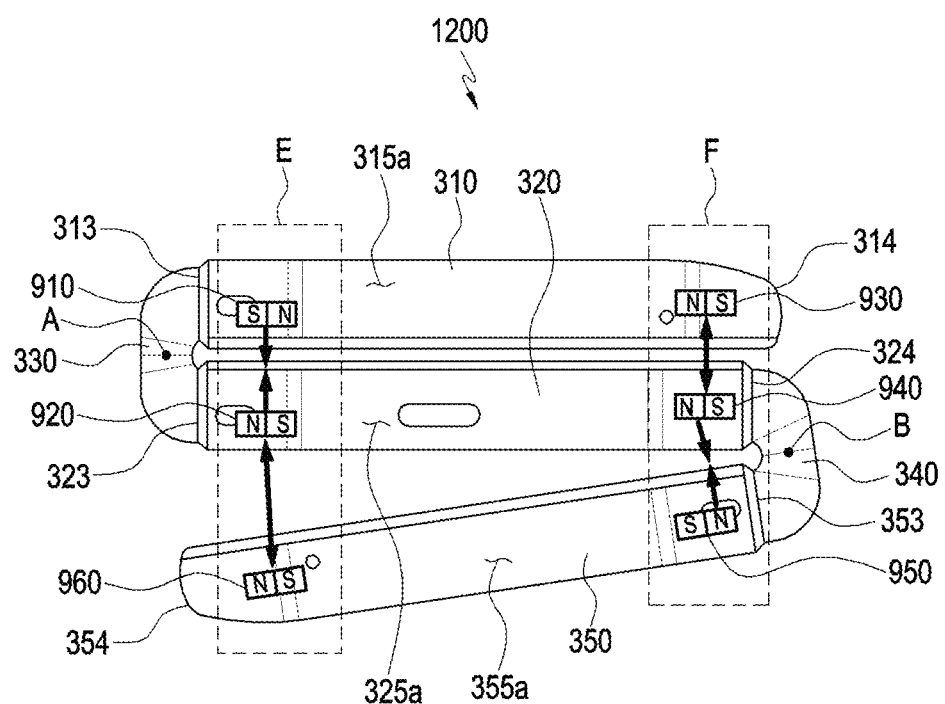
FIG. 15 is a view illustrating interactions of first to sixth magnetic bodies in a process of folding at least a portion of a dual foldable electronic device according to the embodiment illustrated in FIG. 14.

FIG. 14 is a view schematically illustrating a dual foldable electronic device 1200 (or a 3-step foldable electronic device) and arrangement of various components included in the dual foldable electronic device 1200 according to an embodiment that is different from that of FIG. 7. FIG. 15 is a view illustrating interactions of first to sixth magnetic bodies 900 in a process of folding at least a portion of a dual foldable electronic device 1200 according to the embodiment illustrated in FIG. 14. In the embodiment illustrated in FIG. 14, the first, second, and sixth magnetic bodies 910, 920, and 960 are disposed on one side E of the dual foldable electronic device 1200 and the third, fourth, and fifth magnetic bodies 930, 940, and 950 are disposed on the opposite sides F of the dual foldable electronic device 1200, but it should be noted that they may be displayed on one section for convenience of description in FIG. 15.

According to various embodiments of the disclosure, the electronic device 101 of FIG. 1, which has been described above, may correspond to the dual foldable electronic device 1200 (or a 3-step foldable electronic device). According to an embodiment, the dual foldable electronic device 1200 may include a first hinge structure 330 and a second hinge structure 340. Further, the dual foldable electronic device 1200 may include a first housing structure 310 connected to one side of the first hinge structure 330 and a second housing structure 320 connected to an opposite side of the first hinge structure 330, the second housing structure 320 may be connected to one side of the second hinge structure 340, and a third housing structure 350 may be connected to an opposite side of the second hinge structure 340.

The first housing structure 310 of the dual foldable electronic device 1200 may include a first surface (e.g., the first surface 311 of FIG. 4) facing a first direction, a second surface (e.g., the second surface 312 of FIG. 4) facing a second direction that is opposite to the first direction, a first side surface (e.g., the first side surface 313 of FIG. 4) connected to the first hinge structure 330 and being parallel to a first axis A of rotation of the first hinge structure 330, a second side surface 314 facing a direction that is opposite to the first side surface, and a third side surface 315 that is perpendicular to the first axis A of rotation.

The second housing structure 320 of the dual foldable electronic device 1200 may include a third surface (e.g., the third surface 321 of FIG. 4) facing a third direction, a fourth surface (e.g., the fourth surface 322 of FIG. 4) facing a fourth direction that is opposite to the third direction, a fourth side surface (e.g., the fourth side surface 323 of FIG. 4) connected to the first hinge structure 330 and being parallel to the first axis A of rotation of the first hinge structure 330, a fifth side surface 324 facing a direction that is opposite to the fourth side surface, and a sixth side surface 325 that is perpendicular to the first axis A of rotation. The first housing structure 310 and the second housing structure 320 may be folded about the first hinge structure 330.

The third housing structure 350 of the dual foldable electronic device 1200 may include a fifth surface facing a fifth direction, and a sixth surface facing a sixth direction that is opposite to the fifth direction. Although the fifth surface and the sixth surface are not separately illustrated in FIG. 14, the fifth surface may correspond to the first surface (e.g., the first surface 311 of FIG. 4) or the third surface (e.g., the third surface 321 of FIG. 4), and the sixth surface may correspond to the second surface (e.g., the second surface 312 of FIG. 4) or the fourth surface (e.g., the fourth surface 322 of FIG. 4). When the dual foldable electronic device is fully unfolded, the fifth surface may face a direction that is parallel to the direction which the first surface and the third surface face, and the sixth surface may face a direction that is parallel to the direction which the second surface and the fourth surface face.

The dual foldable electronic device 1200 may include a seventh side surface 353 connected to the second hinge structure 340, an eighth side surface 354 facing a direction that is opposite to the seventh side surface 353, and a ninth side surface 355 that is perpendicular to the second axis B of rotation. Here, the ninth side surface 355 may be divided into a (9-1)-th side surface 355a on one side of the third housing structure 350 and a (9-2)-th side surface 355b on an opposite side thereof. According to various embodiments, the second housing structure 320 and the third housing structure 350 may be folded about the second hinge structure 340.

In the foldable housing 300 of the dual foldable electronic device 1200 illustrated in FIGS. 14 and 15, the first housing structure 310 and the second housing structure 320 may be freely folded about the first hinge structure 330 according to a manipulation of a user, other operations of external forces, and/or an angle between the first housing structure 310 and the second housing structure 320 (e.g., may be automatically folded by the locker & closer when the angle between the first housing structure 310 and the second housing structure 320 is a specific angle or less). Separately from the operation or additionally, in the foldable housing 300 of the dual foldable electronic device 1200, the second housing structure 320 and the third housing structure 350 may be freely folded about the second hinge structure 340 according to a manipulation of a user, other operations of external forces, and/or an angle between the second housing structure 320 and the third housing structure 350 (e.g., may be automatically folded by the locker & closer when the angle between the second housing structure 320 and the third housing structure 350 is a specific angle or less). The folding operation using the first hinge structure 330 and the folding operation using the second hinge structure 340 may be performed independently, and may be performed at the same time or at different times.

The flexible display may be viewed from the outside through at least one surface of the foldable housing 300, and may extend from the first surface (e.g., the first surface 311 of FIG. 4) of the first housing structure 310 to the third surface (e.g., the third surface 321 of FIG. 4) of the second housing structure 320 and the fifth surface (not illustrated) of the third housing structure 350.

The dual foldable electronic device 1200 illustrated in FIGS. 14 and 15 may include first to sixth magnetic bodies 900.

According to an embodiment, the first magnetic substance 910 may be disposed adjacent to the third side surface 315 of the first housing structure 310, and the second magnetic substance 920 may be adjacent to the sixth side surface 325 of the second housing structure 320 and may be disposed at a location that is symmetrical to the first magnetic substance 910 with respect to the first hinge structure 330. Here, the first magnetic substance 910 and the second magnetic substance 920 may correspond to the first locker & closer 610 and the second locker & closer 620 illustrated in FIG. 7, respectively.

According to an embodiment, the third magnetic substance 930 may be disposed adjacent to the third side surface 315 of the first housing structure 310, and the fourth magnetic substance 940 may be adjacent to the sixth side surface 325 of the second housing structure 320 and may be disposed at a location that is symmetrical to the third magnetic substance 930 with respect to the first hinge structure 330. Here, the third magnetic substance 930 and the fourth magnetic substance 940 may correspond to the first damper member 710 and the second damper member 720 illustrated in FIG. 7, respectively. The third magnetic substance 930 and the fourth magnetic substance 940 may be disposed adjacent to the third side surface 315 and the sixth side surface 325 on a side surface that is opposite to the first magnetic substance 910 and the second magnetic substance 920, respectively, and may be disposed at locations that are farther from the first hinge structure 330 than the first magnetic substance 910 and the second magnetic substance 920.

According to an embodiment, the fifth magnetic substance 950 may be disposed adjacent to the ninth side surface 355 of the third housing structure 350, and may be disposed at a location that is symmetrical to the fourth magnetic substance 940 with respect to the second hinge structure 340. The sixth magnetic substance 960 may be disposed adjacent to the ninth side surface 355 of the third housing structure 350, and may be disposed at a location that is symmetrical to the second magnetic substance 920 with respect to the second hinge structure 340. Here, the fifth magnetic substance 950 may perform other locker & closer functions that are different from those of the first magnetic substance 910 and the second magnetic substance 920 in relation to the fourth magnetic substance 940. The sixth magnetic substance 960 may perform another function of a damper member that is different from the third magnetic substance 930 and the fourth magnetic substance 940 in relation to the second magnetic substance 920.

Referring to FIG. 15, a status in which the first housing structure 310 is folded with respect to the second housing structure 320 and the second housing structure 320 may be folded with respect to the third housing structure 350 is illustrated. Like in FIG. 13, FIG. 15 may illustrate conceptually as if all of the first to sixth magnetic bodies 900 were disposed one section, for convenience of description. In a status in which the first housing structure 310 is folded with respect to the second housing structure 320 and the second housing structure 320 is folded with respect to the third housing structure 350, the first to sixth magnetic bodies 900 may perform the functions of the locker & closer and/or the damper member through an operation of a repulsive force or an attractive force as they become closer to the other magnetic bodies disposed at locations corresponding to each other. For example, in the embodiment illustrated in FIG. 15, the second magnetic substance 920 may perform a closing function with an operation of an attractive force with the first magnetic substance 910 and may perform a damper function with an operation of a repulsive force with the sixth magnetic substance 960. Further, as an example, in the embodiment illustrated in FIG. 15, the fourth magnetic substance 940 may perform a damper function with an operation of a repulsive force with the third magnetic substance 930 and may perform a closing function with an operation of an attractive force with the fifth magnetic substance 950.

Of course, in the dual foldable electronic device 1200 illustrated in FIGS. 14 and 15, an arrangement relationship between the first to sixth magnetic bodies 900 is not limited to the above-described one. For example, in the dual foldable electronic device 1200 illustrated in FIG. 14, it is illustrated that the fifth magnetic substance 950 is disposed in the (9-1)-th side surface 355a and it is illustrated that the sixth magnetic substance 960 is disposed in the (9-2)-th side surface 355b, but the disclosure is not limited thereto, and they may be disposed at various different locations according to various arrangements of the first to fourth magnetic bodies 910, 920, 930, and 940.

According to various embodiments, the dual foldable electronic device 1200 may additionally include other magnetic bodies, in addition to the first to sixth magnetic bodies 900. However, the plurality of magnetic bodies disposed in the first housing structure 310 and the second housing structure 320 may perform the function of a locker & closer and/or the function of a damper member with respect to each other about the first hinge structure 330, and the plurality of magnetic bodies disposed in the second housing structure 320 and the third housing structure 350 may perform the function of a locker & closer and/or the function of a damper member with respect to each other about the second hinge structure 340.

According to various embodiments of the disclosure, a foldable electronic device (e.g., the foldable electronic device 1000 of FIG. 7) may include: a foldable housing (e.g., the foldable housing 300 of FIG. 7) including: a hinge structure (e.g., the hinge structure 330 of FIG. 7); a first housing structure (e.g., the first housing structure 310 of FIG. 7) including a first surface (e.g., the first surface 311 of FIG. 4) facing a first direction, a second surface (e.g., the second surface 312 of FIG. 4) facing a second direction that is opposite to the first direction, a first side surface (e.g., the first side surface 313 of FIG. 4) connected to the hinge structure and being parallel to an axis of rotation of the hinge structure, a second side surface (e.g., the second side surface 314 of FIG. 4) facing a direction that is opposite to the first side surface, and a third side surface (e.g., the third side surface 315 of FIG. 4) that is perpendicular to the axis of rotation of the hinge structure; and a second housing structure (e.g., the second housing structure 320 of FIG. 7) including a third surface (e.g., the third surface 321 of FIG. 4) facing a third direction, a fourth surface (e.g., the fourth side surface 323 of FIG. 4) facing a fourth direction that is opposite to the third direction, a fourth side surface (e.g., the fourth side surface 323 of FIG. 4) connected to the hinge structure and being parallel to the axis of rotation of the hinge structure, a fifth side surface (e.g., the fifth side surface 324 of FIG. 4) facing a direction that is opposite to the fourth side surface, and a sixth side surface (e.g., the sixth side surface 325 of FIG. 4) that is perpendicular to the axis of rotation of the hinge structure, the second housing structure being foldable with the first housing structure about the hinge structure; a flexible display (e.g., the display 200 of FIG. 2) being viewed from the outside through at least one surface of the foldable housing, and extending from the first surface of the first housing structure to the third surface of the second housing structure; a locker & closer (e.g., the locker & closer 600 of FIG. 7) disposed adjacent to the hinge structure, and configured such that the foldable housing maintains an unfolding status against an external force of a first threshold external force or less or the foldable housing maintains a folding status when an external force of a second threshold external force is applied or a folding angle between the first housing structure and the second housing structure is smaller than a specific angle; a first damper member (e.g., the first damper member 710 of FIG. 7) disposed to a location that is farther than the locker & closer with reference to the hinge structure in the interior of the first housing structure; and a second damper member (e.g., the second damper member 720 of FIG. 7) disposed at a location that is symmetrical to the first damper member with reference to the hinge structure in the interior of the second housing.

According to various embodiments of the disclosure, the locker & closer may include: a first locker & closer (e.g., the first locker & closer 610 of FIG. 7) disposed in the interior of the first housing structure; and a second locker & closer (e.g., the second locker & closer 620 of FIG. 7) disposed at a location that is symmetrical to the first locker & closer with reference to the hinge structure in the interior of the second housing structure.

According to various embodiments of the disclosure, at least a portion of the first locker & closer and at least a portion of the second locker & closer may be disposed in a hinge cover.

According to various embodiments of the disclosure, the first locker & closer may be disposed on the third side surface to be adjacent to the hinge structure, and the second locker & closer may be disposed on the sixth side surface to be adjacent to the hinge structure.

According to various embodiments of the disclosure, each of the first locker & closer and the second locker & closer may include a magnetic substance.

According to various embodiments of the disclosure, one pole and an opposite pole of each of the first locker & closer and the second locker & closer may be disposed to face a direction that is perpendicular to the axis of rotation, and the opposite poles of the first locker & closer and the second locker & closer may face each other in the unfolding status or the folding status of the foldable housing.

According to various embodiments of the disclosure, the first damper member may be disposed on the second side surface and the second damper member may be disposed on the fifth side surface.

According to various embodiments of the disclosure, the first damper member may be disposed on the third side surface and the second damper member may disposed on the sixth side surface.

According to various embodiments of the disclosure, the third side surface may include: a (3-1)-th side surface (e.g., the (3-1)-th side surface 315a of FIG. 7) on one side of the first housing structure; and a (3-2)-th side surface (e.g., the (3-2)-th side surface 315b of FIG. 7) on an opposite side of the first housing structure, the sixth side surface includes: a (6-1)-th side surface (e.g., the (6-1)-th side surface 325a of FIG. 7) on one side of the second housing structure; and a (6-2)-th side surface (e.g., the (6-2)-th side surface 325b of FIG. 7) on an opposite side of the second housing structure, the first damper member may be disposed on the (3-1)-th side surface and the second damper member may be disposed on the (6-1)-th side surface, and the locker & closer member may be disposed on the (3-2)-th side surface and the (6-2)-th side surface.

According to various embodiments of the disclosure, a plurality of first damper members and a plurality of second damper members may be provided.

According to various embodiments of the disclosure, each of the plurality of first damper members and the plurality of second damper members may include a magnetic substance.

According to various embodiments of the disclosure, each of the plurality of first damper members and the plurality of second damper members may further include a shield member (e.g., the shield member 703 of FIGS. 11A-11D) surrounding at least a portion of the first damper members and the second damper members.

According to various embodiments of the disclosure, the foldable electronic device may further include: a second hinge structure (e.g., the second hinge structure 340 of FIG. 14) connected to the fifth side surface (e.g., the fifth side surface 324 of FIG. 7) of the second housing structure; and a third housing structure (e.g., the third housing structure 350 of FIG. 14) including a fifth surface facing a fifth direction, a sixth surface facing a sixth direction that is opposite to the fifth direction, a seventh side surface connected to the second hinge structure, an eighth side surface (e.g., the eighth side surface 354 of FIG. 14) facing a direction that is opposite to the seventh side surface, a ninth side surface (e.g., the ninth side surface 355 of FIG. 14) that is perpendicular to the axis of rotation of the second hinge structure, and being foldable with the second housing structure about the second hinge structure.

According to various embodiments of the disclosure, the locker & closer may include: a first locker & closer disposed on the third side surface; and a second locker & closer disposed on the sixth side surface; and the first damper member may be disposed on the third side surface and the second damper member may be disposed on the sixth side surface, and the foldable electronic device may further include a third locker & closer (e.g., the fifth magnetic substance 950 of FIG. 14) and a third damper member (e.g., the sixth magnetic substance 960 of FIG. 14) on the ninth side surface.

According to various embodiments of the disclosure, the third locker & closer may be disposed at a location that is symmetrical to the second damper member with reference to the second hinge structure, and the third damper member may be disposed at a location that is symmetrical to the second locker & closer with reference to the second hinge structure.

According to various embodiments of the disclosure, a foldable electronic device (e.g., the foldable electronic device 1000 of FIG. 7) may include: a foldable housing (e.g., the foldable housing 300 of FIG. 7) including: a hinge structure (e.g., the hinge structure 330 of FIG. 7); a first housing structure (e.g., the first housing structure 310 of FIG. 7) connected to the hinge structure; and a second housing structure (e.g., the second housing structure 320 of FIG. 7) connected to the hinge structure, and being foldable with the first housing structure about the hinge structure; a flexible display (e.g., the display 200 of FIG. 2) disposed to be adjacent to one surface of the foldable housing so as to be viewed from the outside through at least one surface of the foldable housing; a locker & closer (e.g., the locker & closer 600 of FIG. 7) disposed adjacent to the hinge structure, and configured such that the foldable housing maintains an unfolding status against an external force of a first threshold external force or less or the foldable housing maintains a folding status when an external force of a second threshold external force is applied or a folding angle between the first housing structure and the second housing structure is smaller than a specific angle; a first damper member (e.g., the first damper member 710 of FIG. 7) disposed to a location that is farther than the locker & closer with reference to the hinge structure in the interior of the first housing structure, and including a magnetic substance; and a second damper member (e.g., the second damper member 720 of FIG. 7) disposed at a location that is symmetrical to the first damper member with reference to the hinge structure in the interior of the second housing structure, and including a magnetic substance such that a repulsive force is applied when being adjacent to the first damper.

According to various embodiments of the disclosure, the locker & closer may include: a first locker & closer (e.g., the first locker & closer 610 of FIG. 7) disposed in the interior of the first housing structure; and a second locker & closer (e.g., the second locker & closer 620 of FIG. 7) disposed at a location that is symmetrical to the first locker & closer with reference to the hinge structure in the interior of the second housing structure.

According to various embodiments of the disclosure, each of the first locker & closer and the second locker & closer may include a magnetic substance, and one pole and an opposite pole of each of the first locker & closer and the second locker & closer may be disposed to face a direction that is perpendicular to the axis of rotation, and the opposite poles of the first locker & closer and the second locker & closer may face each other in the unfolding status or the folding status of the foldable housing such that an attractive force is applied.

According to various embodiments of the disclosure, a foldable electronic device (e.g., the foldable electronic device 1200 of FIG. 14) may include: a foldable housing (e.g., the foldable housing 300 of FIG. 14) including: a first hinge structure (e.g., the first hinge structure 330 of FIG. 14) having a first axis of rotation (e.g., the first axis A of rotation of FIG. 14); a second hinge structure (e.g., the second hinge structure 340 of FIG. 14) having a second axis of rotation (e.g., the second axis B of rotation of FIG. 14) that is parallel to the first axis of rotation; a first housing structure (e.g., the first housing structure 310 of FIG. 14) including a first surface (e.g., the first surface 311 of FIG. 14) facing a first direction, a second surface (e.g., the second surface 312 of FIG. 4) facing a second direction that is opposite to the first direction, a first side surface (e.g., the first side surface 313 of FIG. 4) connected to the first hinge structure and being parallel to the first axis of rotation of the first hinge structure, a second side surface (e.g., the second side surface 3414 of FIG. 4) facing a direction that is opposite to the first side surface, and a third side surface (e.g., the third side surface 321 of FIG. 4) that is perpendicular to the first axis of rotation of the hinge structure; a second housing structure (e.g., the second housing structure 320 of FIG. 14) including a third surface (e.g., the third surface 321 of FIG. 4) facing a third direction, a fourth surface (e.g., the fourth surface 322 of FIG. 4) facing a fourth direction that is opposite to the third direction, a fourth side surface (e.g., the fourth side surface 323 of FIG. 4) connected to the first hinge structure and being parallel to the first axis of rotation of the hinge structure, a fifth side surface (e.g., the fifth side surface 324 of FIG. 4) facing a direction that is opposite to the fourth side surface, and a sixth side surface (e.g., the sixth side surface 325 of FIG. 4) that is perpendicular to the first axis of rotation of the hinge structure, the second housing structure being foldable with the first housing structure about the first hinge structure; and a third housing structure (e.g., the third housing structure 350 of FIG. 14) including a fifth surface facing a fifth direction, a sixth surface facing a sixth direction that is opposite to the fifth direction, a seventh side surface connected to the second hinge structure, an eighth side surface (e.g., the eighth side surface 354 of FIG. 14) facing a direction that is opposite to the seventh side surface, a ninth side surface (e.g., the ninth side surface 355 of FIG. 14) that is perpendicular to the second axis of rotation of the second hinge structure, and being foldable with the second housing structure about the second hinge structure; a flexible display (e.g., the display 200 of FIG. 2) being viewed from the outside through at least one surface of the foldable housing, and extending from the first surface of the first housing structure to the third surface of the second housing structure and the fifth surface of the third housing structure; a first magnetic substance (e.g. the first magnetic substance 910 of FIG. 14) disposed to be adjacent to the third side surface of the first housing structure, and a second magnetic substance (e.g., the second magnetic substance 920 of FIG. 14) disposed to be adjacent to the sixth side surface of the second housing structure and disposed at a location that is symmetrical to the first magnetic substance with reference to the first hinge structure; a third magnetic substance (e.g., the third magnetic substance 930 of FIG. 14) disposed to be adjacent to the third side surface of the first housing structure, and a fourth magnetic substance (e.g., the fourth magnetic substance 940 of FIG. 14) disposed to be adjacent to the sixth side surface of the second housing structure and disposed at a location that is symmetrical to the third magnetic substance with reference to the first hinge structure; and a fifth magnetic substance (e.g., the fifth magnetic substance 950 of FIG. 14) disposed to be adjacent to the ninth side surface of the third housing structure and disposed at a location that is symmetrical to the fourth magnetic substance with reference to the second hinge structure, and a sixth magnetic substance (e.g., the sixth magnetic substance 960 of FIG. 14) disposed to be adjacent to the ninth side surface of the third housing structure and disposed at a location that is symmetrical to the second magnetic substance with reference to the second hinge structure.

According to various embodiments of the disclosure, the first magnetic substance and the second magnetic substance may function as a locker & closer configured such that the foldable housing maintains an unfolding status against an external force of a first threshold external force or less or the foldable housing maintains a folding status when an external force of a second threshold external force is applied or a folding angle between the first housing structure and the second housing structure is smaller than a specific angle, the fourth magnetic substance and the fifth magnetic substance may function as a locker & configured such that the foldable housing maintains an unfolding status against an external force of a first threshold external force or less or the foldable housing maintains a folding status when an external force of a second threshold external force is applied or a folding angle between the second housing structure and the third housing structure is smaller than a specific angle, a repulsive force may be generated when the third magnetic substance and the fourth magnetic substance may be adjacent to each other, and a repulsive force may be generated when the second magnetic substance and the sixth magnetic substance are adjacent to each other.

It is noted by those skilled in the art to which the disclosure pertains that the electronic devices 101, 1000, 1100, and 1200 according to various embodiments of the disclosure, which have been described above, are not limited by the above-mentioned embodiments and the drawings, but may be variously replaced, modified, and changed without departing from the scope of the disclosure.

Although the present disclosure has been described with various embodiments, various changes and modifications may be suggested to one skilled in the art. It is intended that the present disclosure encompass such changes and modifications as fall within the scope of the appended claims.

What is claimed is:
1. A foldable electronic device comprising:
a foldable housing comprising a hinge structure, a first housing structure, and a second housing structure configured to be foldable with the first housing structure about the hinge structure, wherein:
the first housing structure includes a first surface facing a first direction, a second surface facing a second direction that is opposite to the first direction, a first side surface connected to the hinge structure and being parallel to an axis of rotation of the hinge structure, a second side surface facing a direction that is opposite to the first side surface, and a third side surface that is perpendicular to the axis of rotation of the hinge structure, and
the second housing structure includes a third surface facing a third direction, a fourth surface facing a fourth direction that is opposite to the third direction, a fourth side surface connected to the hinge structure and being parallel to the axis of rotation of the hinge structure, a fifth side surface facing a direction that is opposite to the fourth side surface, and a sixth side surface that is perpendicular to the axis of rotation of the hinge structure;
a flexible display disposed to be viewed from an outside of the foldable electronic device through at least one surface of the foldable housing, the flexible display extending from the first surface of the first housing structure to the third surface of the second housing structure;
a locker & closer disposed adjacent to the hinge structure and configured such that the foldable housing maintains:
an unfolding status against an external force of a first threshold external force or less, or
a folding status when an external force of a second threshold external force is applied or a folding angle between the first housing structure and the second housing structure is smaller than a specific angle;
a first damper member disposed at a location that is farther than the locker & closer with reference to the hinge structure in an interior of the first housing structure, the first damper member comprising a first magnetic substance; and
a second damper member disposed at a location that is symmetrical to the first damper member with reference to the hinge structure in an interior of the second housing, the second damper member comprising a second magnetic substance such that a repulsive force is applied when being adjacent to the first damper member, and
wherein the locker & closer comprises:
a first locker & closer disposed on the third side surface to be adjacent to the hinge structure, the first locker & closer comprising a third magnetic substance; and
a second locker & closer is disposed on the sixth side surface to be adjacent to the hinge structure, the second locker & closer comprising a fourth magnetic substance, such that an attractive force is applied when the first locker & closer and the second locker & closer face each other in the unfolding status or the folding status of the foldable housing.

2. The foldable electronic device of claim 1, wherein at least a portion of the first locker & closer and at least a portion of the second locker & closer are disposed in a hinge cover.

3. The foldable electronic device of claim 1, wherein:
one pole and an opposite pole of each of the first locker & closer and the second locker & closer are disposed to face a direction that is perpendicular to the axis of rotation; and
the opposite pole of each of the first locker & closer and the second locker & closer face each other in the unfolding status or the folding status of the foldable housing.

4. The foldable electronic device of claim 1, wherein:
the first damper member is disposed on the second side surface; and
the second damper member is disposed on the fifth side surface.

5. The foldable electronic device of claim 1, wherein:
the first damper member is disposed on the third side surface;
and the second damper member is disposed on the sixth side surface.

6. The foldable electronic device of claim 5, wherein:
the third side surface comprises:
a (3-1)-th side surface on one side of the first housing structure, and
a (3-2)-th side surface on an opposite side of the first housing structure opposite of the one side;
the sixth side surface comprises:
a (6-1)-th side surface on one side of the second housing structure; and
a (6-2)-th side surface on an opposite side of the second housing structure opposite of the one side;
the first damper member is disposed on the (3-1)-th side surface and the second damper member is disposed on the (6-1)-th side surface; and
the locker & closer member is disposed on the (3-2)-th side surface and the second locker & closer member is disposed on the (6-2)-th side surface.

7. The foldable electronic device of claim 1, wherein a plurality of first damper members and a plurality of second damper members are provided.

8. The foldable electronic device of claim 7, wherein each of the plurality of first damper members and each of the plurality of second damper members further comprises a shield member surrounding at least a portion of the first damper member and the second damper member.

9. The foldable electronic device of claim 1, further comprising:
a second hinge structure connected to the fifth side surface of the second housing structure; and
a third housing structure comprising a fifth surface facing a fifth direction, a sixth surface facing a sixth direction that is opposite to the fifth direction, a seventh side surface connected to the second hinge structure, an eighth side surface facing a direction that is opposite to the seventh side surface, a ninth side surface that is perpendicular to the axis of rotation of the second hinge structure, and configured to be foldable with the second housing structure about the second hinge structure.

10. The foldable electronic device of claim 9, wherein:
the locker & closer comprises:
a first locker & closer disposed on the third side surface; and
a second locker & closer disposed on the sixth side surface,
the first damper member is disposed on the third side surface and the second damper member is disposed on the sixth side surface; and
the foldable electronic device further comprises a third locker & closer and a third damper member on the ninth side surface.

11. The foldable electronic device of claim 10, wherein:
the third locker & closer is disposed at a location that is symmetrical to the second damper member with reference to the second hinge structure; and
the third damper member is disposed at a location that is symmetrical to the second locker & closer with reference to the second hinge structure.

12. A foldable electronic device comprising:
a foldable housing comprising a hinge structure, a first housing structure connected to the hinge structure, and a second housing structure connected to the hinge structure and configured to be foldable with the first housing structure about the hinge structure;
a flexible display disposed to be adjacent to one surface of the foldable housing so as to be viewed from an outside through at least one surface of the foldable housing;
a locker & closer disposed adjacent to the hinge structure, and configured such that the foldable housing maintains:
an unfolding status against an external force of a first threshold external force or less, or
a folding status when an external force of a second threshold external force is applied or a folding angle between the first housing structure and the second housing structure is smaller than a specific angle;
a first damper member disposed at a location that is farther than the locker & closer with reference to the hinge structure in an interior of the first housing structure, the first damper member comprising a first magnetic substance; and
a second damper member disposed at a location that is symmetrical to the first damper member with reference to the hinge structure in an interior of the second housing structure, the second damper member comprising a second magnetic substance such that a repulsive force is applied when being adjacent to the first damper member, wherein the locker & closer comprises:
 a first locker & closer disposed in the interior of the first housing structure; and
 a second locker & closer disposed at a location that is symmetrical to the first locker & closer with reference to the hinge structure in the interior of the second housing structure, and wherein:
 the first locker & closer comprises a third magnetic substance;
 the second locker & closer comprises a fourth magnetic substance;
 one pole and an opposite pole of each of the first locker & closer and the second locker & closer are disposed to face a direction that is perpendicular to an axis of rotation; and
 the opposite pole of the first locker & closer and the opposite pole of the second locker & closer face each other in the unfolding status or the folding status of the foldable housing such that an attractive force is applied.

13. A foldable electronic device comprising:
a foldable housing comprising a first hinge structure having a first axis of rotation, a second hinge structure having a second axis of rotation that is parallel to the first axis of rotation, a first housing structure, a second housing structure configured to be foldable with the first housing structure about the first hinge structure, and a third housing structure configured to be foldable with the second housing structure about the second hinge structure, wherein:
 the first housing structure includes a first surface facing a first direction, a second surface facing a second direction that is opposite to the first direction, a first side surface connected to the first hinge structure and being parallel to the first axis of rotation of the first hinge structure, a second side surface facing a direction that is opposite to the first side surface, and a third side surface that is perpendicular to the first axis of rotation of the first hinge structure,
 the second housing structure includes a third surface facing a third direction, a fourth surface facing a fourth direction that is opposite to the third direction, a fourth side surface connected to the first hinge structure and being parallel to the first axis of rotation of the first hinge structure, a fifth side surface facing a direction that is opposite to the fourth side surface, and a sixth side surface that is perpendicular to the first axis of rotation of first the hinge structure, and
 the third housing structure includes a fifth surface facing a fifth direction, a sixth surface facing a sixth direction that is opposite to the fifth direction, a seventh side surface connected to the second hinge structure, an eighth side surface facing a direction that is opposite to the seventh side surface, a ninth side surface that is perpendicular to the second axis of rotation of the second hinge structure;
 a flexible display disposed to be viewed from an outside of the foldable electronic device through at least one surface of the foldable housing, the flexible display extending from the first surface of the first housing structure to the third surface of the second housing structure and the fifth surface of the third housing structure;
 a first magnetic substance disposed to be adjacent to the third side surface of the first housing structure;
 a second magnetic substance disposed to be adjacent to the sixth side surface of the second housing structure and disposed at a location that is symmetrical to the first magnetic substance with reference to the first hinge structure;
 a third magnetic substance disposed to be adjacent to the third side surface of the first housing structure;
 a fourth magnetic substance disposed to be adjacent to the sixth side surface of the second housing structure and disposed at a location that is symmetrical to the third magnetic substance with reference to the first hinge structure; a fifth magnetic substance disposed to be adjacent to the ninth side surface of the third housing structure and disposed at a location that is symmetrical to the fourth magnetic substance with reference to the second hinge structure; and
 a sixth magnetic substance disposed to be adjacent to the ninth side surface of the third housing structure and disposed at a location that is symmetrical to the second magnetic substance with reference to the second hinge structure, and wherein:
 the first magnetic substance and the second magnetic substance function as a locker & closer by an attractive force which is applied between the first magnetic substance and the second magnetic substance and are configured such that the foldable housing maintains:
  an unfolding status against an external force of a first threshold external force or less, or
  a folding status when an external force of a second threshold external force is applied or a folding angle between the first housing structure and the second housing structure is smaller than a specific angle;
 the fourth magnetic substance and the fifth magnetic substance function as a locker & closer by an attractive force which is applied between the fourth magnetic substance and the fifth magnetic substance and are configured such that the foldable housing maintains:
  an unfolding status against an external force of a first threshold external force or less, or
  a folding status when an external force of a second threshold external force is applied or a folding angle between the second housing structure and the third housing structure is smaller than a specific angle;
 a repulsive force is generated when the third magnetic substance and the fourth magnetic substance are adjacent to each other; and
 a repulsive force is generated when the second magnetic substance and the sixth magnetic substance are adjacent to each other.

* * * * *